(12) United States Patent
Park et al.

(10) Patent No.: US 9,178,039 B2
(45) Date of Patent: Nov. 3, 2015

(54) SEMICONDUCTOR DEVICE

(71) Applicant: SAMSUNG ELECTRONICS CO., LTD., Suwon-si, Gyeonggi-do (KR)

(72) Inventors: Jae-Hwa Park, Yongin-si (KR);
Woong-Hee Sohn, Hwasung (KR);
Man-Sug Kang, Suwon-si (KR);
Hee-Sook Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 43 days.

(21) Appl. No.: 14/052,072

(22) Filed: Oct. 11, 2013

(65) Prior Publication Data

US 2014/0159145 A1 Jun. 12, 2014

(30) Foreign Application Priority Data

Dec. 6, 2012 (KR) .................. 10-2012-0141235

(51) Int. Cl.
*H01L 29/66* (2006.01)
*H01L 27/108* (2006.01)

(52) U.S. Cl.
CPC .... *H01L 29/66621* (2013.01); *H01L 27/10876* (2013.01)

(58) Field of Classification Search
None
See application file for complete search history.

(56) References Cited

U.S. PATENT DOCUMENTS

| 6,420,189 B1* | 7/2002 | Lopatin ........................ 438/2 |
| 6,544,888 B2 | 4/2003 | Lee |
| 8,008,144 B2 | 8/2011 | Ananthan et al. |
| 2002/0160573 A1* | 10/2002 | Peake et al. ............... 438/270 |
| 2010/0193901 A1 | 8/2010 | Jang et al. |
| 2011/0180868 A1* | 7/2011 | Jang ........................... 257/330 |
| 2011/0260239 A1* | 10/2011 | Oyu ............................ 257/330 |

FOREIGN PATENT DOCUMENTS

| KR | 10-2004-0006472 A | 1/2004 |
| KR | 10-2010-0077603 A | 7/2010 |
| KR | 10-2010-0077617 A | 7/2010 |
| KR | 10-2011-0125385 A | 11/2011 |

* cited by examiner

*Primary Examiner* — Bilkis Jahan
*Assistant Examiner* — Kevin Quinto
(74) *Attorney, Agent, or Firm* — Lee & Morse, P.C.

(57) ABSTRACT

A semiconductor device includes a gate trench across an active region of a semiconductor substrate, a gate structure filling the gate trench, and source/drain regions formed in the active region at respective sides of the gate structure. The gate structure includes a sequentially stacked gate electrode and insulating capping pattern, and a gate dielectric layer between the gate electrode and the active region. The gate electrode is located at a lower level than an upper surface of the active region and includes a barrier conductive pattern and a gate conductive pattern. The gate conductive pattern includes a first part having a first width and a second part having a second width greater than the first width. The barrier conductive pattern is interposed between the first part of the gate conductive pattern and the gate dielectric layer.

14 Claims, 39 Drawing Sheets

SEMICONDUCTOR DEVICE

CROSS-REFERENCE TO RELATED APPLICATION

Korean Patent Application No. 10-2012-0141235 filed on Dec. 6, 2013, in the Korean Intellectual Property Office, and entitled: "SEMICONDUCTOR DEVICE," is incorporated by reference herein in its entirety.

BACKGROUND

1. Field

Embodiments relate to a semiconductor device, a method of fabricating the same, and a semiconductor module and electronic system including the same.

2. Description of Related Art

As the integration of a semiconductor device increases, gate-induced drain leakage (GIDL) current characteristics significantly affect the performance of the semiconductor device in a three-dimensional transistor.

SUMMARY

Embodiments are directed to a semiconductor device including a gate trench across an active region of a semiconductor substrate, a gate structure filling the gate trench, and source/drain regions formed in the active region at respective sides of the gate structure. The gate structure includes a sequentially stacked gate electrode and insulating capping pattern, and a gate dielectric layer between the gate electrode and the active region. The gate electrode is located at a lower level than an upper surface of the active region and includes a barrier conductive pattern and a gate conductive pattern. The gate conductive pattern includes a first part having a first width and a second part having a second width greater than the first width. The barrier conductive pattern is interposed between the first part of the gate conductive pattern and the gate dielectric layer.

The gate conductive pattern may include a grain, the grain having substantially a same width as the gate conductive pattern.

The gate conductive pattern may include a first grain in the first part and a second grain in the second part. The second grain may have a greater width than the first grain in the first part.

The first grain in the first part of the gate conductive pattern may have a first width, the second grain in the second part of the gate conductive pattern has a second width, and the second width of the second grain is greater than the first width of the first grain.

The gate conductive pattern may include a grain having a greater width than the barrier conductive pattern.

At least one of the source/drain regions may face at least a portion of the second part of the gate conductive pattern.

The gate conductive pattern may be formed of a material having a lower work function than the barrier conductive pattern.

The source/drain regions, the gate dielectric layer, and the gate electrode may form a transistor. The active region located between the source/drain regions may constitute a channel region of the transistor. The barrier conductive pattern may face the channel region. The second part of the gate conductive pattern faces the source/drain regions.

The second part of the gate conductive pattern may cover an upper end of the barrier conductive pattern.

The first part of the gate conductive pattern may be spaced apart from the gate dielectric layer. The second part of the gate conductive pattern is in contact with the gate dielectric layer.

Embodiments are also directed to a semiconductor device including a gate trench across an active region of a semiconductor substrate, a gate structure in the gate trench, and source/drain regions formed in the active region located at both sides of the gate structure. The gate structure includes a gate electrode in the gate trench, an insulating capping pattern on the gate electrode, and a gate dielectric layer between the gate electrode and the active region. The gate electrode includes a first gate conductive pattern spaced apart from the gate dielectric layer and including a first metal material, a first barrier conductive pattern in contact with the gate dielectric layer and including a conductive material different from the first metal material, and a second barrier conductive pattern in contact with the gate dielectric layer, arranged on the first barrier conductive pattern, and including a nitride or carbide of the first metal material.

The gate electrode may further include a second gate conductive pattern located on the first gate conductive pattern. The second gate conductive pattern may include the first metal material.

The second barrier conductive pattern may include a first part interposed between the first and second gate conductive patterns, a second part interposed between the second gate conductive pattern and the gate dielectric layer, and a third part interposed between the first gate conductive pattern and the gate dielectric layer.

The first barrier conductive pattern may be located at a lower level than an upper surface of the first gate conductive pattern.

The first barrier conductive pattern may face the active region located between the source/drain regions. The second barrier conductive pattern faces the source/drain regions.

Embodiments are also directed to a semiconductor device including a gate trench across an active region of a semiconductor substrate, a gate structure filling the gate trench, and source/drain regions formed in the active region at respective sides of the gate structure, a buried channel region being defined in the active region between the source/drain regions. The gate structure includes a gate dielectric layer lining the gate trench, a barrier conductive pattern partially lining the gate dielectric layer, the barrier conductive pattern being located in at least a lower portion of the gate trench adjacent to a lower portion of the buried channel region, a gate conductive pattern in the gate trench, a topmost level of the gate conductive pattern being lower than an upper surface of the active region, an upper portion of the gate conductive pattern overlapping an upper portion of the buried channel region and a lower portion of the source/drain regions, and a lower portion of the gate conductive pattern overlapping the lower portion of the buried channel region, and an insulating capping layer stacked on the gate conductive pattern. The gate conductive pattern is formed of a metal material having a lower work function than the barrier conductive pattern. The barrier conductive pattern is between the gate conductive pattern and the gate dielectric layer in at least the lower portion of the gate trench adjacent to the lower portion of the buried channel region.

The gate conductive pattern may include at least one of tungsten and nitrogen-containing tungsten, and the barrier conductive pattern includes at least one of titanium nitride or tantalum nitride.

The upper portion of the gate conductive pattern may directly contact the dielectric layer.

The barrier conductive pattern may include a first barrier conductive pattern between the lower portion of the gate conductive pattern and the dielectric layer, and a second barrier conductive pattern between the upper portion of the gate conductive pattern and the dielectric layer.

The second barrier conductive pattern may extend between the upper portion of the gate conductive pattern and the lower portion of the gate conductive pattern.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
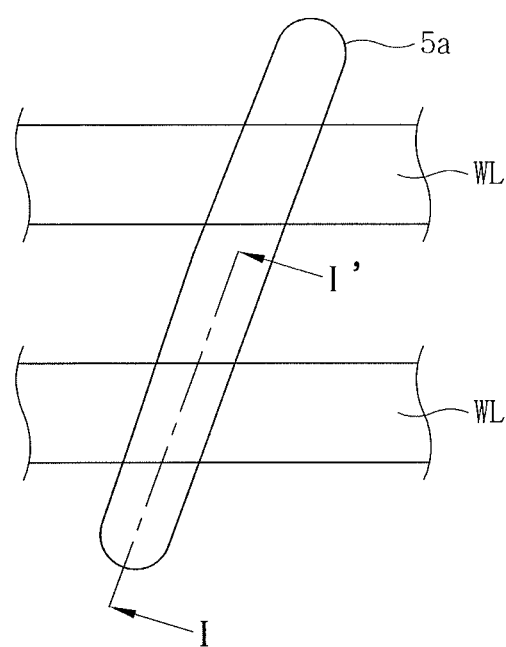
FIG. 1 illustrates a plan view showing a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

FIG. 1 is a plan view showing a semiconductor device in accordance with an embodiment. FIGS. 2A, 2B, and 3 to 13 are cross-sectional views showing various examples of a semiconductor device in accordance with embodiments. FIGS. 2A, 2B, and 3 to 13 are cross-sectional views showing an area taken along line I-I' of FIG. 1.

Figure 2A:
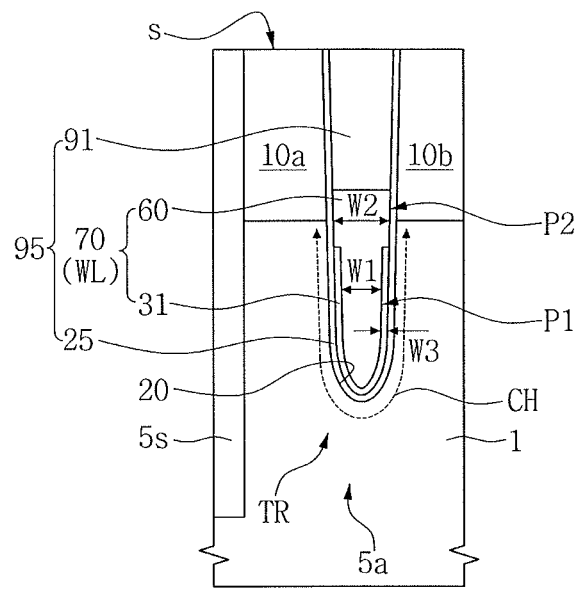
FIGS. 2A and 2B illustrate cross-sectional views showing a semiconductor device in accordance with an embodiment.
Figure 2B:
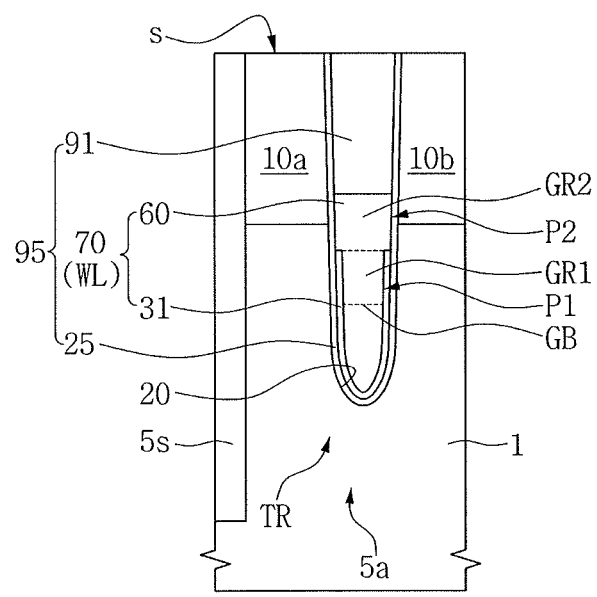

FIGS. 2A and 2B are cross-sectional view showing a semiconductor device in accordance with an embodiment. FIG. 2B is a view showing an example of grains of a gate electrode of FIG. 2A. FIG. 2A is a cross-sectional view showing an area taken along line I-I' of FIG. 1.

Referring to FIGS. 1 and 2A, a semiconductor substrate 1 is provided. The semiconductor substrate 1 may be a substrate formed of a semiconductor material such as silicon. A device isolation region 5s defining an active region 5a may be provided in the semiconductor substrate 1. The device isolation region 5s may be a trench-type device isolation region. The device isolation region 5s may include an insulating material such as silicon oxide.

A gate trench 20 across the active region 5a may be provided. The gate trench 20 may cross the active region 5a and extend to the device isolation region 5s.

A gate structure 95 may be provided in the gate trench 20. The gate structure 95 may fill the gate trench 20.

First and second source/drain regions 10a and 10b may be provided in the active region 5a at respective sides of the gate structure 95.

The gate structure 95 may include a gate dielectric layer 25, a gate electrode 70, and an insulating capping pattern 91. The gate electrode 70 and the insulating capping pattern 91 may be sequentially stacked. The insulating capping pattern 91 may be formed of silicon nitride. The gate electrode 70 may be located at a lower level of the gate trench, with respect to an upper surface S of the active region 5a. A bottom surface of the insulating capping pattern 91 may be located at a lower level than the upper surface S of the active region 5a.

The gate dielectric layer 25 may include a first part interposed between the gate electrode 70 and an inner wall of the gate trench 20, and a second part interposed between the insulating capping pattern 91 and the inner wall of the gate trench 20. For example, the first part of the gate dielectric layer 25 may be interposed between the gate electrode 70 and the active region 5a, and the second part of the gate dielectric layer 25 may be interposed between the insulating capping pattern 91 and the active region 5a. The gate dielectric layer 25 may include silicon oxide or a high dielectric material.

The gate electrode 70 may include a barrier conductive pattern 31 and a gate conductive pattern 60. The gate conductive pattern 60 may include a first part P1 having a first width W1 and a second part P2 having a second width W2 greater than the first width W1. The first part P1 of the gate conductive pattern 60 may be spaced apart from the gate dielectric layer 25, for example, with the barrier conductive pattern 31 interposed therebetween, and the second part P2 of the gate conductive pattern 60 may be in contact with the gate dielectric layer 25. In the gate conductive pattern 60, the first part P1 may have a greater thickness than the second part P2. Here, the thickness may be a thickness in a substantially perpendicular direction with respect to the upper surface S of the active region 5a.

The barrier conductive pattern 31 may be interposed between the first part P1 of the gate conductive pattern 60 and the gate dielectric layer 25. The barrier conductive pattern 31 may be located at a lower level than the second part P2 of the gate conductive pattern 60, and may be in contact with the gate dielectric layer 25. An upper end of the barrier conductive pattern 31 may be covered by the second part P2 of the gate conductive pattern 60. The barrier conductive pattern 31 may be formed to surround side and bottom surfaces of the first part P1 of the gate conductive pattern 60. The barrier conductive pattern 31 may have a third width W3 smaller than the first or second widths, W1 or W2, of the gate conductive pattern 60. The barrier conductive pattern 31 may be spaced apart from the insulating capping pattern 91. The barrier conductive pattern 31 may be located at a lower level than at least one of the first and second source/drain regions 10a and 10b.

The gate electrode 70, the gate dielectric layer 25, and the first and second source/drain regions 10a and 10b may form a transistor TR. The transistor TR may be an NMOS transistor. For example, the active region 5a may have p-type conductivity, and the first and second source/drain regions 10a and 10b may have n-type conductivity. The transistor TR may be a cell transistor of a memory device such as a DRAM. The gate electrode 70 may be a wordline of the memory device such as the DRAM. The active region 5a located between the first and second source/drain regions 10a and 10b may provide a channel region CH of the transistor TR. The barrier conductive pattern 31 may face the channel region CH. The second part P2 of the gate conductive pattern 60 may include a part facing the first and second source/drain regions 10a and 10b. A part of the second part P2 of the gate conductive pattern 60, for example, an upper portion of the second part P2 of the gate conductive pattern 60, may face at least one of the first and second source/drain regions 10a and 10b, and another part of the second part P2, for example, a lower portion of the second part P2 of the gate conductive pattern 60, may face the channel region CH.

The gate conductive pattern 60 may be formed of a metal material having a lower work function than the barrier conductive pattern 31. The gate conductive pattern 60 may be formed of a first metal material, and the barrier conductive pattern 31 may be formed of a nitride of a second metal material different from the first metal material. For example, the gate conductive pattern 60 may be formed of a tungsten layer or a tungsten layer including nitrogen, and the barrier conductive pattern 31 may be formed of a conductive material such as titanium nitride (TiN) or tantalum nitride (TaN).

When the transistor TR is a cell transistor of a DRAM, leakage current of the transistor TR may be minimized by forming each of the gate conductive pattern 60 and the barrier conductive pattern 31 with a conductive material having a different work function from the other. For example, the second part P2 of the gate conductive pattern 60 facing the first source/drain area 10a may have a lower work function than the barrier conductive pattern 31 facing the channel region CH. Accordingly, a gate-induced drain leakage (GIDL) current of the DRAM cell transistor that may occur when the transistor TR is in an off-state may decrease. As the GIDL current of the DRAM cell transistor decreases, refresh characteristics of the DRAM may be improved.

In addition, the gate conductive pattern 60 may be formed of a metal material (e.g., W) having superior electric conductivity characteristics. Accordingly, interconnection resistance characteristics of the word line WL may be improved.

The material forming the gate conductive pattern 60 may be in the form of grains. The gate conductive pattern 60 having grains will be described with reference to FIG. 2B. The shapes of grains and grain boundaries illustrated in FIG. 2B may be schematically illustrated. Accordingly, the shapes of the grains and grain boundaries may vary from what is shown in FIG. 2B.

Referring to FIG. 2B, the gate conductive pattern 60 may have two or more grains. The gate conductive pattern 60 may have a first grain GR1 and a second grain GR2. The gate conductive pattern 60 may have a grain boundary GB.

The first part P1 of the gate conductive pattern 60 may have the first grain GR1, and the second part P2 may have the second grain GR2. In the first part P1 of the gate conductive pattern 60, the first grain GR1 may have substantially the same width as the first width W1 of the first part P1. The first grain GR1 may have a greater width than the barrier conductive pattern 31. In the second part P2 of the gate conductive pattern 60, the second grain GR2 may have the substantially same width as the second width W2 of the second part P2.

The grain boundary GB may be formed substantially in a horizontal direction. The gate conductive pattern 60 may have first and second sides facing each other, and the grain boundary GB may be formed in a direction from the first side to the second side of the gate conductive pattern 60. For example, the grain boundary GB may extend from the first side to the second side of the gate conductive pattern 60. Accordingly, the grains GR1 and GR2 having the substantially same width as the gate conductive pattern 60 may be provided.

Figure 3:
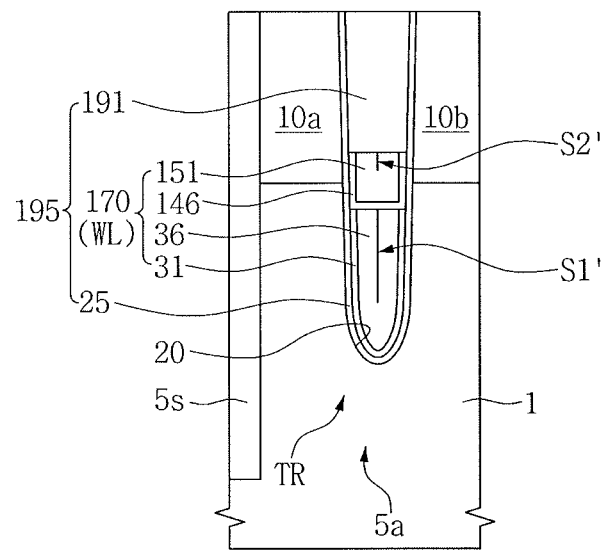
FIG. 3 illustrates a cross-sectional view showing a semiconductor device in accordance with another embodiment.

Referring to FIG. 3, a semiconductor device in accordance with another embodiment will be described.

Referring to FIGS. 1 and 3, the gate trench 20 across the active region 5a may be provided in the semiconductor substrate 1. A gate structure 195 may be provided in the gate trench 20.

The gate structure 195 may include a gate dielectric layer 25, a gate electrode 170, and an insulating capping pattern 191. The gate electrode 170 and the insulating capping pattern 191 may be sequentially stacked. The gate electrode 170 may be located at a lower level than an upper surface of the active region 5a. The gate dielectric layer 25 may be interposed between the gate electrode 170 and the active region 5a, and between the insulating capping pattern 191 and the active region 5a. First and second source/drain regions 10a and 10b may be provided in the active region 5a located at respective sides of the gate structure 195.

The first and second source/drain regions 10a and 10b, the gate dielectric layer 25, and the gate electrode 170 may form a transistor TR. The transistor TR may be a cell transistor of a DRAM, and the gate electrode 170 may be a wordline of the DRAM.

The gate electrode 170 may include a first barrier conductive pattern 31, a first gate conductive pattern 36, a second barrier conductive pattern 146, and a second gate conductive pattern 151. The first barrier conductive pattern 31 may be interposed between the first gate conductive pattern 36 and the gate dielectric layer 25. The first barrier conductive pattern 31 surround side and bottom surfaces of the first gate conductive pattern 36. The second gate conductive pattern 151 may be on the first gate conductive pattern 36. The second barrier conductive pattern 146 may be interposed between the second gate conductive pattern 151 and the gate dielectric layer 25, and between the second gate conductive pattern 151 and the first gate conductive pattern 36.

At least one of the first and second source/drain regions 10a and 10b may face a part of the second barrier conductive pattern 146. For example, at least one of the first and second source/drain regions 10a and 10b may have a junction depth located between an upper end and a lower end of the second barrier conductive pattern 146. The first gate conductive pattern 36 may have a lower seam S1'. The lower seam S1' may extend from a center of an upper surface of the first gate conductive pattern 36 to the inside of the first gate conductive pattern 36. The lower seam S1' may be spaced apart from a lower surface of the first gate conductive pattern 36. The second gate conductive pattern 151 may have an upper seam S2'. The upper seam S2' may extend from a center of an upper surface of the second gate conductive pattern 151 to the inside of the second gate conductive pattern 151. The upper seam S2' may be spaced apart from a lower surface of the second gate conductive pattern 151. The length of the upper seam S2' may be greater than that of the lower seam S1'. In other implementations, the length of the upper seam S2' may be less than that of the lower seam S1'.

The first and second gate conductive patterns 36 and 151 may be formed of a first metal material such as W. The first barrier conductive pattern 31 may be formed of a nitride (e.g., TiN or TaN) of a second metal material different from the first metal material. In order to reduce a leakage current of the transistor TR and lower a resistance of the gate electrode 170 used as the wordline WL, the second barrier conductive pattern 146 may be formed of a nitride (e.g., WN) or carbide (e.g., WC) of the first metal material having a lower work function than the first barrier conductive pattern 31.

Figure 4:
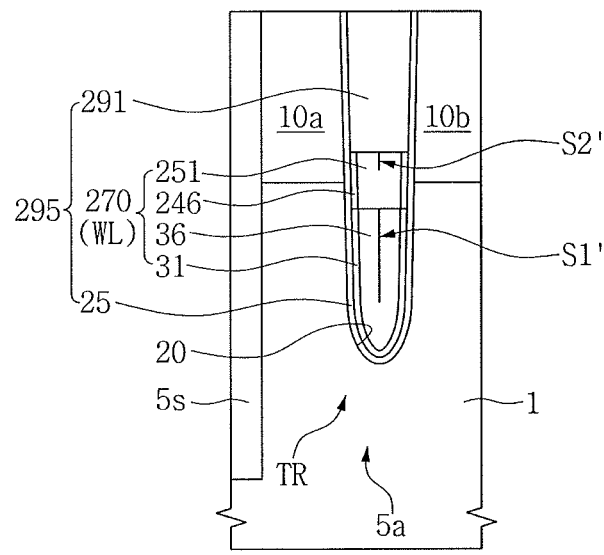
FIG. 4 illustrates a cross-sectional view showing a semiconductor device in accordance with still another embodiment.

Referring to FIG. 4, a semiconductor device in accordance with still another embodiment will be described.

Referring to FIGS. 1 and 4, the gate trench 20 across the active region 5a may be provided in the semiconductor substrate 1. A gate structure 295 may be provided in the gate trench 20. First and second source/drain regions 10a and 10b may be provided in the active region 5a located at respective sides of the gate structure 295. The gate structure 295 may include a gate dielectric layer 25, a gate electrode 270, and an insulating capping pattern 291. The gate electrode 270 and the insulating capping pattern 291 may be sequentially stacked. The gate dielectric layer 25 may be interposed between the gate electrode 270 and the active region 5a, and between the insulating capping pattern 291 and the active region 5a.

The first and second source/drain regions 10a and 10b, the gate dielectric layer 25, and the gate electrode 270 may form a transistor TR. The transistor TR may be a cell transistor of a memory device such as a DRAM, and the gate electrode 270 may be a wordline WL of the memory device.

The gate electrode 270 may include a first barrier conductive pattern 31, a first gate conductive pattern 36, a second barrier conductive pattern 246, and a second gate conductive pattern 251. The first barrier conductive pattern 31 may surround side and bottom surfaces of the first gate conductive pattern 36. The second gate conductive pattern 251 may be on the first gate conductive pattern 36. The second gate conductive pattern 251 may be in contact with the first gate conductive pattern 36. The second barrier conductive pattern 246 may be interposed between the second gate conductive pattern 251 and the gate dielectric layer 25.

At least one of the first and second source/drain regions 10a and 10b may face a part of the second barrier conductive pattern 246. For example, at least one of the first and second source/drain regions 10a and 10b may have a junction depth located between an upper end and a lower end of the second barrier conductive pattern 246.

The first gate conductive pattern 36 may have a lower seam S1'. The lower seam S1' may extend from a center of an upper surface of the first gate conductive pattern 36 to the inside of the first gate conductive pattern 36. The second gate conductive pattern 251 may have an upper seam S2'. The upper seam S2' may extend from a center of an upper surface of the second gate conductive pattern 251 to the inside of the second gate conductive pattern 251. The upper seam S2' may be spaced apart from the lower seam S1'.

The first and second gate conductive patterns 36 and 251 may be formed of a first metal material such as W. The second barrier conductive pattern 146 may be formed of a nitride (e.g., WN) or carbide (e.g., WC) of the first metal material. The first barrier conductive pattern 31 may be formed of a conductive material having a greater work function than the second barrier conductive pattern 146. The first barrier conductive pattern 31 may be formed of a nitride (e.g., TiN or TaN) of a second metal material different from the first metal material. The GIDL current of the transistor TR may be reduced by forming the second barrier conductive pattern 146 from a material having a lower work function than the first barrier conductive pattern 31.

Figure 5:
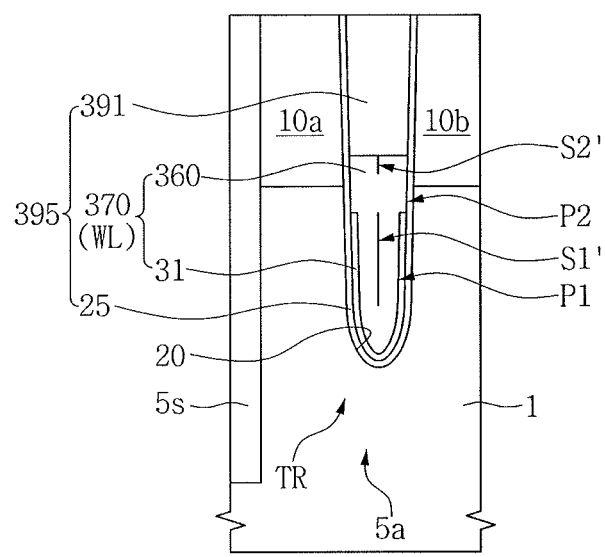
FIG. 5 illustrates a cross-sectional view showing a semiconductor device in accordance with still another embodiment.

Referring to FIG. 5, a semiconductor device in accordance with still another embodiment will be described.

Referring to FIGS. 1 and 5, the gate trench 20 across the active region 5a may be provided in the semiconductor substrate 1. A gate structure 395 filling the gate trench 20 may be provided. First and second source/drain regions 10a and 10b may be provided in the active region 5a located at respective sides of the gate structure 395. The gate structure 395 may include a gate dielectric layer 25, a gate electrode 370, and an insulating capping pattern 391. The first and second source/drain regions 10a and 10b, the gate dielectric layer 25, and the gate electrode 370 may form a transistor TR. The gate electrode 370 may be a wordline WL of a memory device. The gate electrode 370 and the insulating capping pattern 391 may be sequentially stacked. The gate dielectric layer 25 may be interposed between the gate electrode 370 and the active region 5a, and between the insulating capping pattern 391 and the active region 5a. The gate electrode 370 may include a barrier conductive pattern 31 and a gate conductive pattern 360.

The gate conductive pattern 360, like the gate conductive pattern 60 of FIG. 2A, may include a first part P1 having a first width and a second part P2 having a second width greater than the first width. The gate conductive pattern 360 may have a lower seam S1' in the first part P1 and an upper seam S2' in the second part P2. The lower seam S1' and the upper seam S2' may be spaced apart from each other. The barrier conductive pattern 31 may be arranged to surround side and bottom surfaces of the first part P1 of the gate conductive pattern 360. The gate conductive pattern 360 may be formed of a first metal material such as W. The barrier conductive pattern 31 may be formed of a conductive material having a greater work function than the first metal material. The barrier conductive pattern 31 may be formed of a nitride (e.g., TiN or TaN) of a second metal material different from the first metal material.

Figure 6:
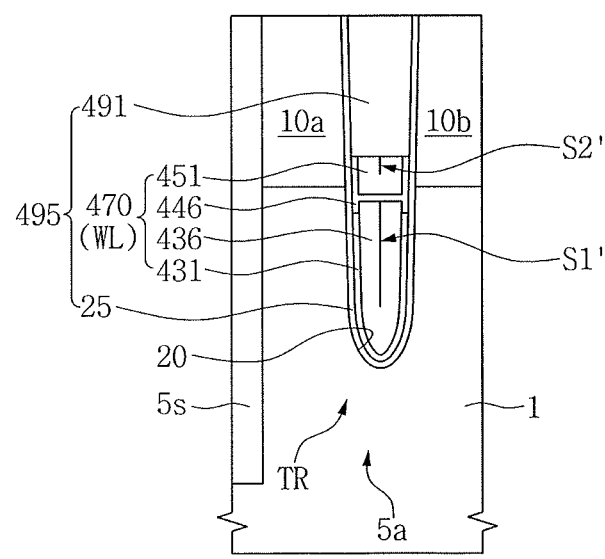
FIG. 6 illustrates a cross-sectional view showing a semiconductor device in accordance with still another embodiment.

Referring to FIG. 6, a semiconductor device in accordance with still another embodiment will be described.

Referring to FIGS. 1 and 6, the gate trench 20 across the active region 5a may be provided in the semiconductor substrate 1. A gate structure 495 filling the gate trench 20 may be provided. First and second source/drain regions 10a and 10b may be provided in the active region 5a located at respective sides of the gate structure 495. The gate structure 495 may include a gate dielectric layer 25, a gate electrode 470, and an insulating capping pattern 491. The first and second source/drain regions 10a and 10b, the gate dielectric layer 25, and the gate electrode 470 may form a transistor TR. The gate electrode 470 may be a wordline WL of a memory device. The gate electrode 470 and the insulating capping pattern 491 may be sequentially stacked. The gate dielectric layer 25 may be interposed between the gate electrode 470 and the active region 5a, and between the insulating capping pattern 491 and the active region 5a.

The gate electrode 470 may include a first barrier conductive pattern 431, a first gate conductive pattern 436, a second barrier conductive pattern 446, and a second gate conductive pattern 451. The first barrier conductive pattern 431 may be interposed between the first gate conductive pattern 436 and the gate dielectric layer 25. The first barrier conductive pattern 431 may be located at a lower level than an upper surface of the first gate conductive pattern 436, and may surround a top and a part of side surfaces of the first gate conductive pattern 436. The second gate conductive pattern 451 may be arranged on the first gate conductive pattern 436.

The first gate conductive pattern 436 may have a lower seam S1', and the second gate conductive pattern 451 may have an upper seam S2'. The lower seam S1' and the upper seam S2' may be spaced apart from each other.

The second barrier conductive pattern 446 may include a first part interposed between the first and second conductive patterns 436 and 451, a second part interposed between an upper side surface of the first gate conductive pattern 436 and the gate dielectric layer 25, and a third part interposed between the second gate conductive pattern 451 and the gate dielectric layer 25. The second barrier conductive pattern 446 may be an H-shape in the cross-section.

At least one of the first and second source/drain regions 10a and 10b may face a part of the second barrier conductive pattern 446. For example, at least one of the first and second source/drain regions 10a and 10b may have a junction depth located between an upper end and a lower end of the second barrier conductive pattern 446.

The first and second gate conductive patterns 436 and 451 may be formed of a first metal material such as W.

In order to reduce a leakage current of the transistor TR and lower a resistance of the gate electrode 470 used as the wordline WL, the first barrier conductive pattern 431 may be formed of a nitride (e.g., TiN or TaN) of a second metal material different from the first metal material, and the second barrier conductive pattern 446 may be formed of a nitride (e.g., WN) or carbide (e.g., WC) of the first metal material having a lower work function than the first barrier conductive pattern 431.

Figure 7:
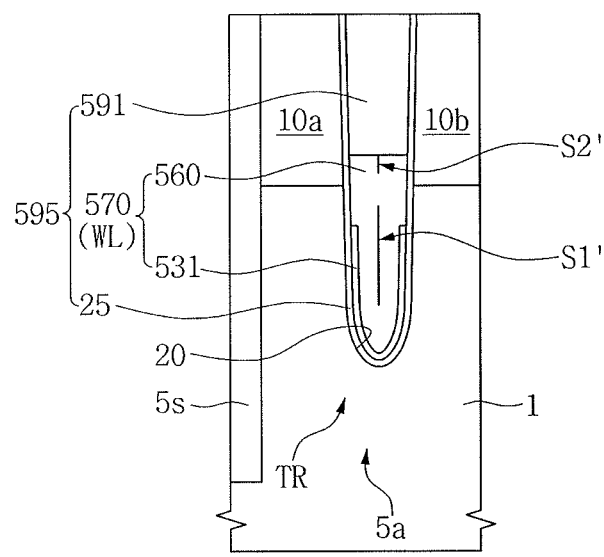
FIG. 7 illustrates a cross-sectional view showing a semiconductor device in accordance with still another embodiment.

Referring to FIG. 7, a semiconductor device in accordance with still another embodiment will be described.

Referring to FIGS. 1 and 7, the gate trench 20 across the active region 5a may be provided in the semiconductor substrate 1. A gate structure 595 filling the gate trench 20 may be provided. First and second source/drain regions 10a and 10b may be provided in the active region 5a located at respective sides of the gate structure 595. The gate structure 595 may include a gate dielectric layer 25, a gate electrode 570, and an insulating capping pattern 591. The first and second source/drain regions 10a and 10b, the gate dielectric layer 25, and the gate electrode 570 may form a transistor TR. The gate electrode 570 may be a wordline WL of a memory device. The gate dielectric layer 25 may be interposed between the gate electrode 570 and the active region 5a, and between the insulating capping pattern 591 and the active region 5a. The gate electrode 570 and the insulating capping pattern 591 may be sequentially stacked. The gate electrode 570 may include a barrier conductive pattern 531 and a gate conductive pattern 560.

The gate conductive pattern 560, like the gate conductive pattern 60 of FIG. 2A, may include a first part P1 having a first width and a second part P2 having a second width greater than the first width. The barrier conductive pattern 531 may be interposed between the first part P1 of the gate conductive pattern 560 and the gate dielectric layer 25. The gate conductive pattern 560 may have a lower seam S1' extending from the inside of the first part P1 to the inside of the second part P2, and an upper seam S2' located inside the second part P2. The lower seam S1' and the upper seam S2' may be spaced apart from each other. An upper end of the lower seam S1' may be located at a higher level than the barrier conductive pattern 531. At least one of the first and second source/drain regions 10a and 10b may face a portion of the second part P2 of the gate conductive pattern 560. In order to reduce a leakage current of the transistor TR and lower a gate resistance, the gate conductive pattern 560 may be formed of a first metal material such as W, and the barrier conductive pattern 531 may be formed of a nitride (e.g., TiN or TaN) of a second metal material different from the first metal material.

Figure 8:
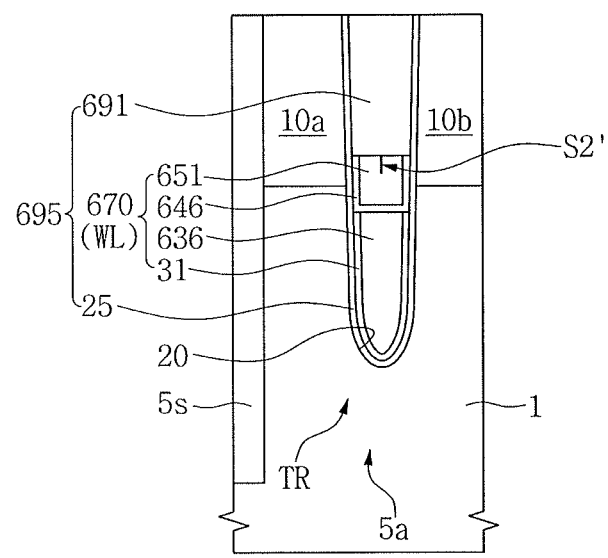
FIG. 8 illustrates a cross-sectional view showing a semiconductor device in accordance with still another embodiment.

Referring to FIG. 8, a semiconductor device in accordance with still another embodiment will be described.

Referring to FIGS. 1 and 8, the gate trench 20 across the active region 5a may be provided in the semiconductor substrate 1. A gate structure 695 may be provided in the gate trench 20. The gate structure 695 may include a gate dielectric layer 25, a gate electrode 670, and an insulating capping pattern 691. First and second source/drain regions 10a and 10b may be arranged in the active region 5a located at both sides of the gate structure 695. The first and second source/drain regions 10a and 10b, the gate dielectric layer 25, and the gate electrode 670 may form a transistor TR. The gate electrode 670 may be a wordline WL of a memory device. The gate electrode 670 and the insulating capping pattern 691 may be sequentially stacked. The gate dielectric layer 25 may be interposed between the gate electrode 670 and the active region 5a, and between the insulating capping pattern 691 and the active region 5a.

The gate electrode 670 may include a first barrier conductive pattern 31, a first gate conductive pattern 636, a second barrier conductive pattern 646, and a second gate conductive pattern 651. The first barrier conductive pattern 31 may be interposed between the first gate conductive pattern 636 and the gate dielectric layer 25. The second gate conductive pattern 651 may be on the first gate conductive pattern 636. The second barrier conductive pattern 646 may be interposed between the second gate conductive pattern 651 and the gate dielectric layer 25, and between the second gate conductive pattern 651 and the first gate conductive pattern 636. At least one of the first and second source/drain regions 10a and 10b may face a part of the second barrier conductive pattern 646. The first gate conductive pattern 636 may be formed of a seamless polycrystalline-structured metal material. The second gate conductive pattern 651 may have an upper seam S2'. The upper seam S2' may extend from a center of an upper surface of the second gate conductive pattern 651 to the inside of the second gate conductive pattern 651.

In order to improve leakage current and gate resistance characteristics of the transistor TR, the first and second gate conductive patterns 636 and 651 may be formed of a first metal material such as W, the first barrier conductive pattern 31 may be formed of a nitride (e.g., TiN or TaN) of a second metal material different from the first metal material, and the second barrier conductive pattern 646 may be formed of a nitride (e.g., WN) or carbide (e.g., WC) of the first metal material.

Next, referring to FIG. 9, a semiconductor device in accordance with still another embodiment will be described.

Figure 9:
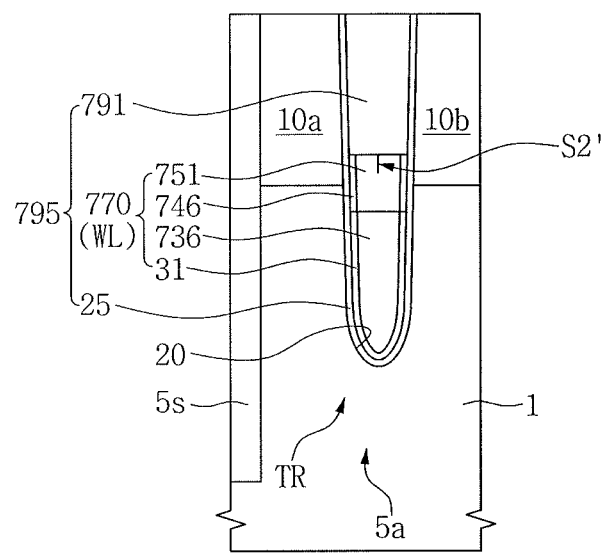
FIG. 9 illustrates a cross-sectional view showing a semiconductor device in accordance with still another embodiment.

Referring to FIGS. 1 and 9, the gate trench 20 across the active region 5a may be provided in the semiconductor substrate 1. A gate structure 795 may be provided in the gate trench 20. First and second source/drain regions 10a and 10b may be provided in the active region 5a located at respective sides of the gate structure 795. The gate structure 795 may include a gate dielectric layer 25, a gate electrode 770, and an insulating capping pattern 791. The first and second source/drain regions 10a and 10b, the gate dielectric layer 25, and the gate electrode 770 may form a transistor TR. The transistor TR may be a cell transistor of a memory device such as a DRAM, and the gate electrode 770 may be a wordline WL of the memory device. The gate electrode 770 and the insulating capping pattern 791 may be sequentially stacked. The gate dielectric layer 25 may be interposed between the gate electrode 770 and the active region 5a, and between the insulating capping pattern 791 and the active region 5a. The gate electrode 770 may include a first barrier conductive pattern 31, a first gate conductive pattern 736, a second barrier conductive pattern 746, and a second gate conductive pattern 751. The first barrier conductive pattern 31 may be arranged to surround side and bottom surfaces of the first gate conductive pattern 736. The second gate conductive pattern 751 may be arranged on the first gate conductive pattern 736. The second gate conductive pattern 751 may be in contact with the first gate conductive pattern 736. The second barrier conductive pattern 746 may be interposed between the second gate conductive pattern 751 and the gate dielectric layer 25. At least one of the first and second source/drain regions 10a and 10b may face a part of the second barrier conductive pattern 746.

The first gate conductive pattern 736 may be formed of a first metal material having a seamless polycrystalline-structure. The second gate conductive pattern 751 may have an upper seam S2'. The upper seam S2' may extend from a center of an upper surface of the second gate conductive pattern 751 to the inside of the second gate conductive pattern 751.

In order to improve leakage current and gate resistance characteristics of the transistor TR, the first and second gate conductive patterns 736 and 751 may be formed of a first metal material such as W, the first barrier conductive pattern 31 may be formed of a nitride (e.g., TiN or TaN) of a second metal material different from the first metal material, and the second barrier conductive pattern 746 may be formed of a nitride (e.g., WN) or carbide (e.g., WC) of the first metal material.

Figure 10:
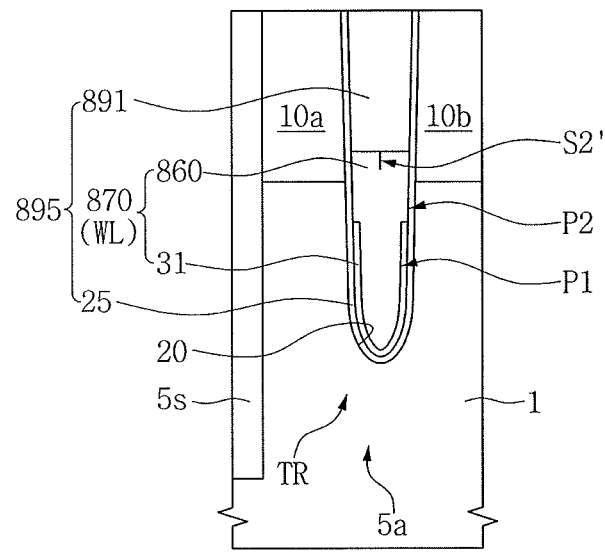
FIG. 10 illustrates a cross-sectional view showing a semiconductor device in accordance with still another embodiment.

Referring to FIG. 10, a semiconductor device in accordance with still another embodiment will be described.

Referring to FIGS. 1 and 10, the gate trench 20 across the active region 5a may be provided in the semiconductor substrate 1. A gate structure 895 filling the gate trench 20 may be provided. First and second source/drain regions 10a and 10b may be provided in the active region 5a located at respective sides of the gate structure 895. The gate structure 895 may include a gate dielectric layer 25, a gate electrode 870, and an insulating capping pattern 891. The first and second source/drain regions 10a and 10b, the gate dielectric layer 25, and the gate electrode 870 may form a transistor TR. The gate electrode 870 may be a wordline WL of a memory device. The gate electrode 870 and the insulating capping pattern 891 may be sequentially stacked. The gate dielectric layer 25 may be interposed between the gate electrode 870 and the active region 5a, and between the insulating capping pattern 891 and the active region 5a. The gate electrode 870 may include a barrier conductive pattern 31 and a gate conductive pattern 860.

The gate conductive pattern 860, like the gate conductive pattern 60 of FIG. 2A, may include a first part P1 having a first width and a second part P2 having a second width greater than the first width. The gate conductive pattern 860 may have an upper seam S2' located in the second part P2. In the gate conductive pattern 860, the first part P1 may be a seamless polycrystalline structure, and the second part P2 may be a polycrystalline structure having the upper seam S2'. The barrier conductive pattern 31 may be arranged to surround side and bottom surfaces of the first part P1 of the gate conductive pattern 860.

In order to improve leakage current and gate resistance characteristics of the transistor TR, the gate conductive pattern 860 may be formed of a first metal material such as W, and the barrier conductive pattern 31 may be formed of a nitride (e.g., TiN or TaN) of a second metal material different from the first metal material.

Figure 11:
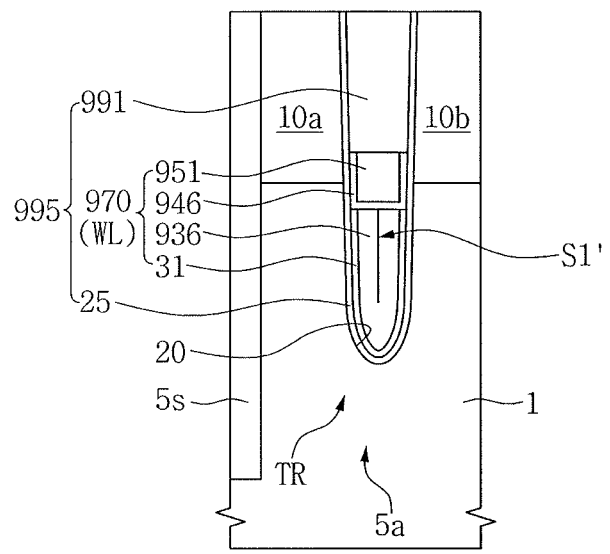
FIG. 11 illustrates a cross-sectional view showing a semiconductor device in accordance with still another embodiment.

Referring to FIG. 11, a semiconductor device in accordance with still another embodiment will be described.

Referring to FIGS. 1 and 11, the gate trench 20 across the active region 5a may be provided in the semiconductor substrate 1. A gate structure 995 may be provided in the gate trench 20. The gate structure 995 may include a gate dielectric layer 25, a gate electrode 970, and an insulating capping pattern 991. First and second source/drain regions 10a and 10b may be provided in the active region 5a located at respective sides of the gate structure 995. The first and second source/drain regions 10a and 10b, the gate dielectric layer 25, and the gate electrode 970 may form a transistor TR. The gate electrode 970 and the insulating capping pattern 991 may be sequentially stacked. The gate electrode 970 may be located at a lower level than an upper surface of the active region 5a. The gate electrode 970 may be a wordline WL of a memory device. The gate dielectric layer 25 may be interposed between the gate electrode 970 and the active region 5a, and between the insulating capping pattern 991 and the active region 5a.

The gate electrode 970 may include a first barrier conductive pattern 31, a first gate conductive pattern 936, a second barrier conductive pattern 946, and a second gate conductive pattern 951. The first barrier conductive pattern 31 may be interposed between the first gate conductive pattern 936 and the gate dielectric layer 25. The second gate conductive pattern 951 may be on the first gate conductive pattern 936. The second barrier conductive pattern 946 may be interposed between the second gate conductive pattern 951 and the gate dielectric layer 25, and between the second gate conductive pattern 951 and the first gate conductive pattern 936. At least one of the first and second source/drain regions 10a and 10b may face at least a part of the second barrier conductive pattern 946. The first gate conductive pattern 936 may have a lower seam S'. The lower seam S1' may extend from a center of an upper surface of the first gate conductive pattern 936 to the inside of the first gate conductive pattern 936. The second gate conductive pattern 951 may be formed of a metal material having a seamless polycrystalline structure In order to improve leakage current and gate resistance characteristics of the transistor TR, the first and second gate conductive patterns 936 and 951 may be formed of a first metal material such as W, the first barrier conductive pattern 31 may be formed of a nitride (e.g., TiN or TaN) of a second metal material different from the first metal material, and the second barrier conductive pattern 946 may be formed of a nitride (e.g., WN) or carbide (e.g., WC) of the first metal material.

Figure 12:
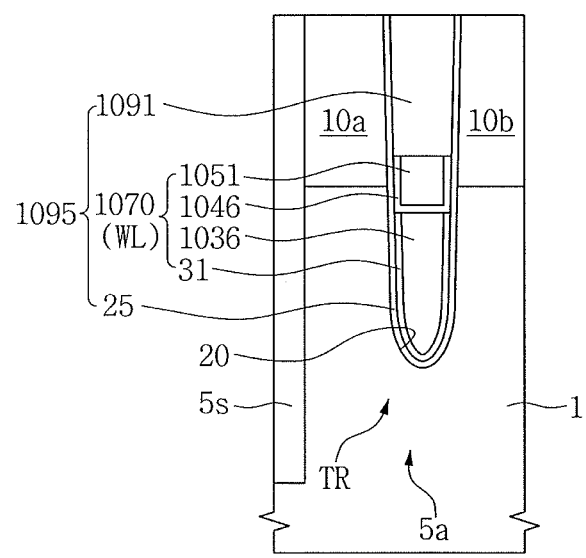
FIG. 12 illustrates a cross-sectional view showing a semiconductor device in accordance with still another embodiment.

Referring to FIG. 12, a semiconductor device in accordance with still another embodiment will be described.

Referring to FIGS. 1 and 12, the gate trench 20 across the active region 5a may be provided in the semiconductor substrate 1. A gate structure 1095 may be provided in the gate trench 20. The gate structure 1095 may include a gate dielectric layer 25, a gate electrode 1070, and an insulating capping pattern 1091. First and second source/drain regions 10a and 10b may be provided in the active region 5a located at respective sides of the gate structure 1095. The first and second source/drain regions 10a and 10b, the gate dielectric layer 25, and the gate electrode 1070 may form a transistor TR. The gate electrode 1070 and the insulating capping pattern 1091 may be sequentially stacked. The gate electrode 1070 may be located at a lower level than an upper surface of the active region 5a. The gate electrode 1070 may be a wordline WL of a memory device. The gate dielectric layer 25 may be interposed between the gate electrode 1070 and the active region 5a, and between the insulating capping pattern 1091 and the active region 5a.

The gate electrode 1070 may include a first barrier conductive pattern 31, a first gate conductive pattern 1036, a second barrier conductive pattern 1046, and a second gate conductive pattern 1051. The first barrier conductive pattern 31 may be interposed between the first gate conductive pattern 1036 and the gate dielectric layer 25. The second gate conductive pattern 1051 may be on the first gate conductive pattern 1036. The second barrier conductive pattern 1046 may be interposed between the second gate conductive pattern 1051 and the gate dielectric layer 25, and between the second gate conductive pattern 1051 and the first gate conductive pattern 1036. At least one of the first and second source/drain regions 10a and 10b may face at least a part of the second barrier conductive pattern 1046.

In order to improve leakage current and gate resistance characteristics of the transistor TR, the first and second gate conductive patterns 1036 and 1051 may be formed of a metal material having a seamless polycrystalline structure, a first metal material such as W, the first barrier conductive pattern 31 may be formed of a nitride (e.g., TiN or TaN) of a second metal material different from the first metal material, and the second barrier conductive pattern 946 may be formed of a nitride (e.g., WN) or carbide (e.g., WC) of the first metal material.

Figure 13:
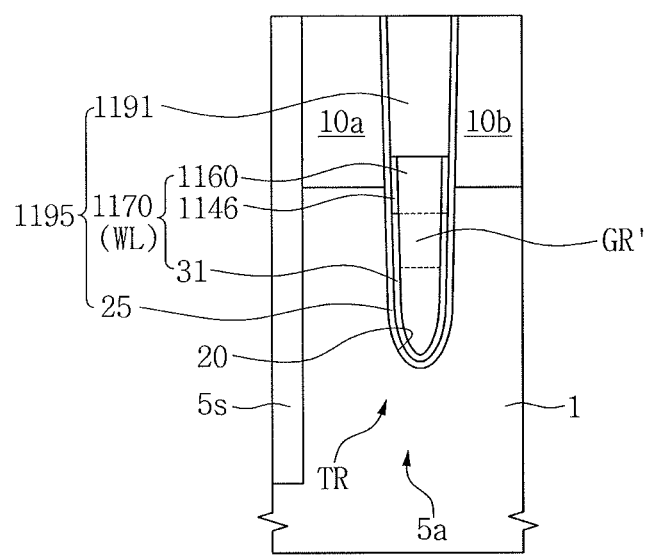
FIG. 13 illustrates a cross-sectional view showing a semiconductor device in accordance with still another embodiment.

Referring to FIG. 13, a semiconductor device in accordance with still another embodiment will be described.

Referring to FIGS. 1 and 13, the gate trench 20 across the active region 5a may be provided in the semiconductor substrate 1. A gate structure 1195 may be provided in the gate trench 20. First and second source/drain regions 10a and 10b may be provided in the active region 5a located at both sides of the gate structure 1195. The gate structure 1195 may include a gate dielectric layer 25, a gate electrode 1170, and an insulating capping pattern 1191.

The first and second source/drain regions 10a and 10b, the gate dielectric layer 25, and the gate electrode 1170 may form a transistor TR. The transistor TR may be a cell transistor of a memory device such as a DRAM and the gate electrode 1170 may be a wordline WL of the memory device. The gate electrode 1170 and the insulating capping pattern 1191 may be sequentially stacked. The gate dielectric layer 25 may be interposed between the gate electrode 1170 and the active region 5a, and between the insulating capping pattern 1191 and the active region 5a.

The gate electrode 1170 may include a first barrier conductive pattern 31, a second barrier conductive pattern 1146, and a gate conductive pattern 1160. The first and second barrier conductive patterns 31 and 1146 may be interposed between the gate conductive pattern 1160 and the gate dielectric layer 25. The second barrier conductive pattern 1146 may be on the first barrier conductive pattern 31. At least one of the first and second source/drain regions 10a and 10b may face at least a part of the second barrier conductive pattern 1146. The gate conductive pattern 1160 may have grains GR'.

In order to improve leakage current and gate resistance characteristics of the transistor TR, the gate conductive patterns 1160 may be formed of a first metal material (e.g., W) having a seamless polycrystalline structure, the first barrier conductive pattern 31 may be formed of a nitride (e.g., TiN or TaN) of a second metal material different from the first metal material, and the second barrier conductive pattern 1146 may be formed of a nitride (e.g., WN) or carbide (e.g., WC) of the first metal material. The gate conductive pattern 1160 may have grains GR'. The grains GR' may have the substantially same width as the gate conductive pattern 1160.

Next, methods of fabricating semiconductor devices in accordance with various embodiments will be described.

Figure 16A:
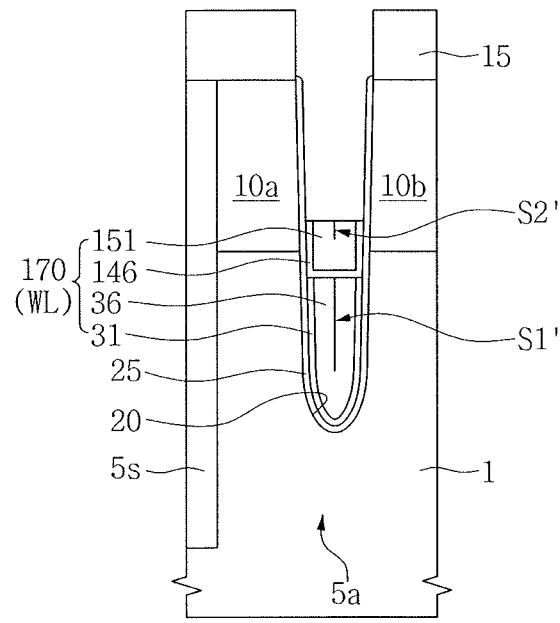
FIGS. 16A and 16B illustrate cross-sectional views showing stages of a method of fabricating a semiconductor device in accordance with still another embodiment.
Figure 16B:
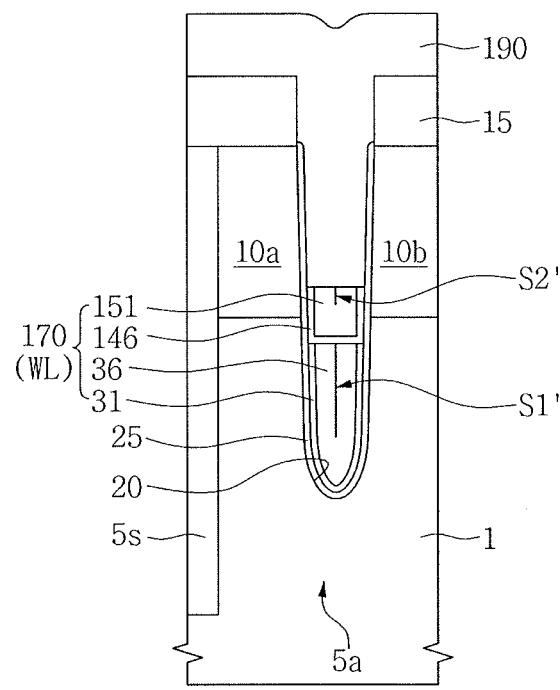
Figure 17A:
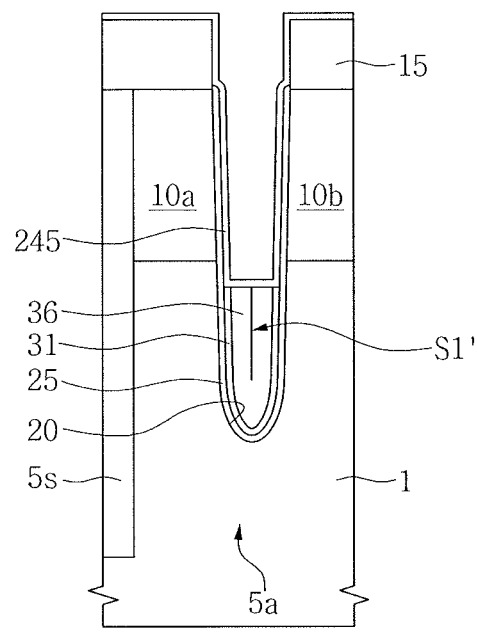
FIGS. 17A to 17C illustrate cross-sectional views showing stages of a method of fabricating a semiconductor device in accordance with still another embodiment.
Figure 17B:
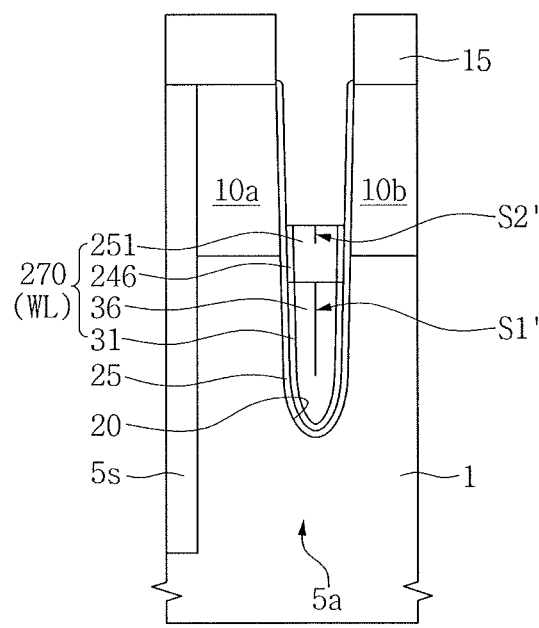
Figure 17C:
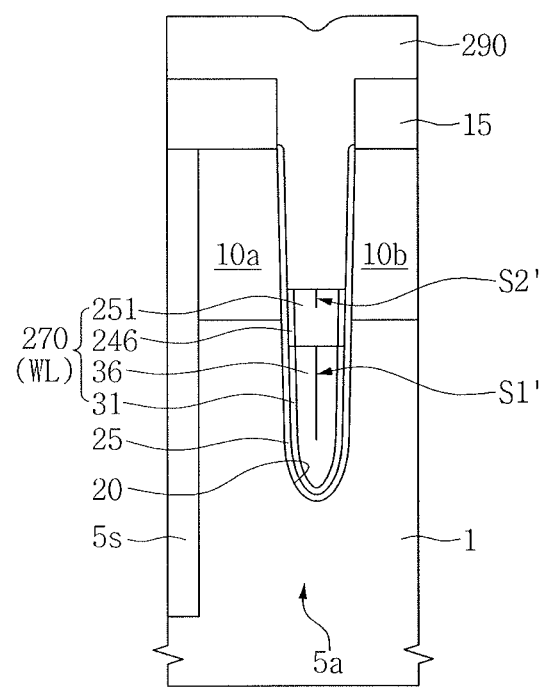
Figure 18A:
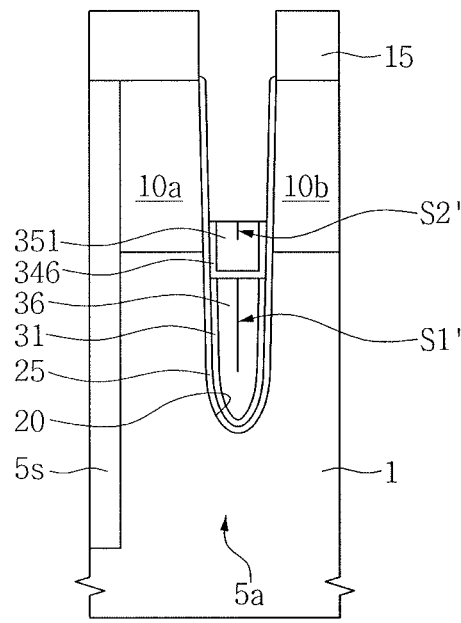
FIGS. 18A to 18C illustrate cross-sectional views showing stages of a method of fabricating a semiconductor device in accordance with still another embodiment.
Figure 18B:
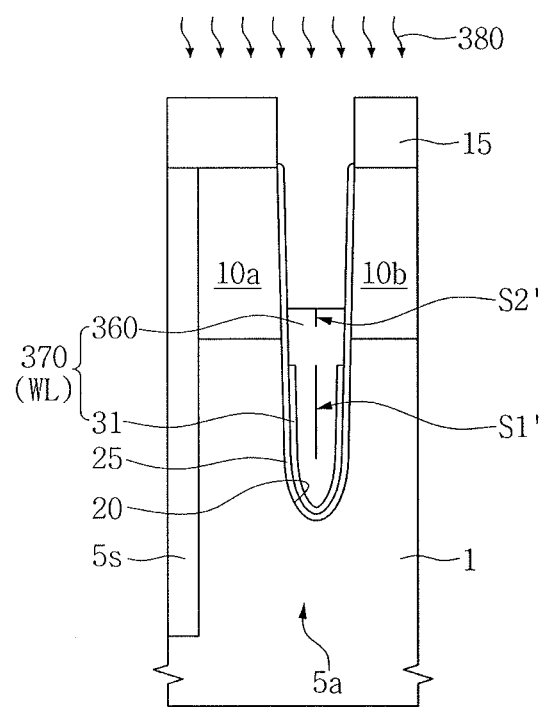
Figure 18C:
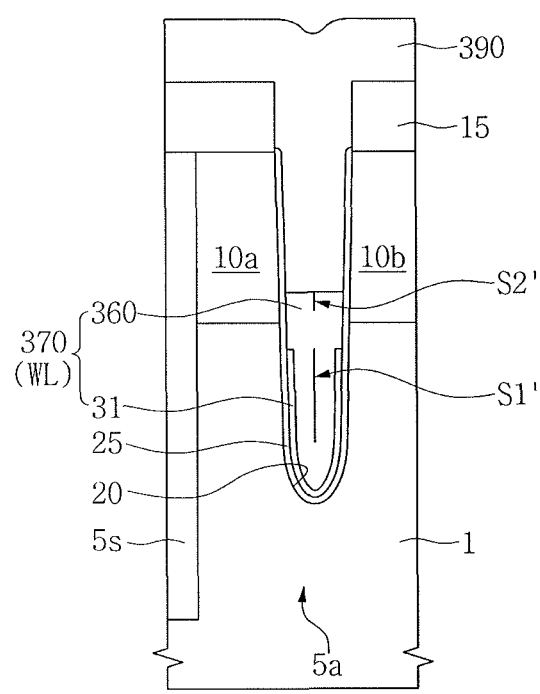
Figure 22A:
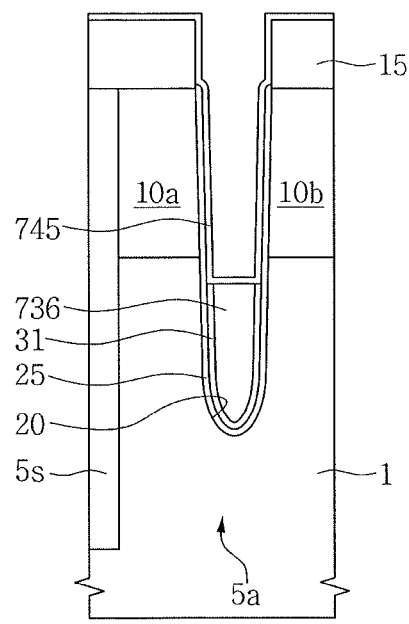
FIGS. 22A to 22C illustrate cross-sectional views showing stages of a method of fabricating a semiconductor device in accordance with still another embodiment.
Figure 22B:
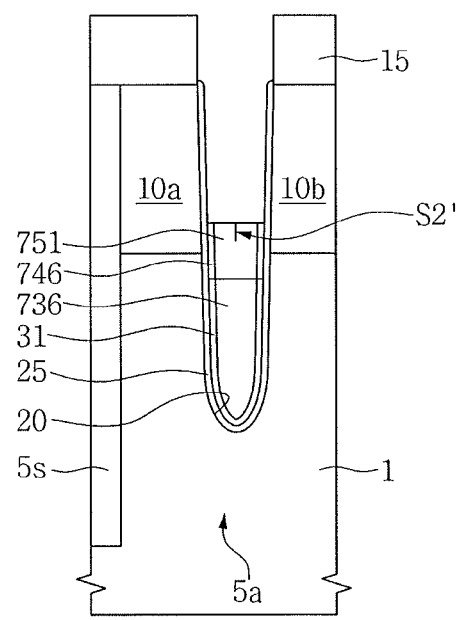
Figure 22C:
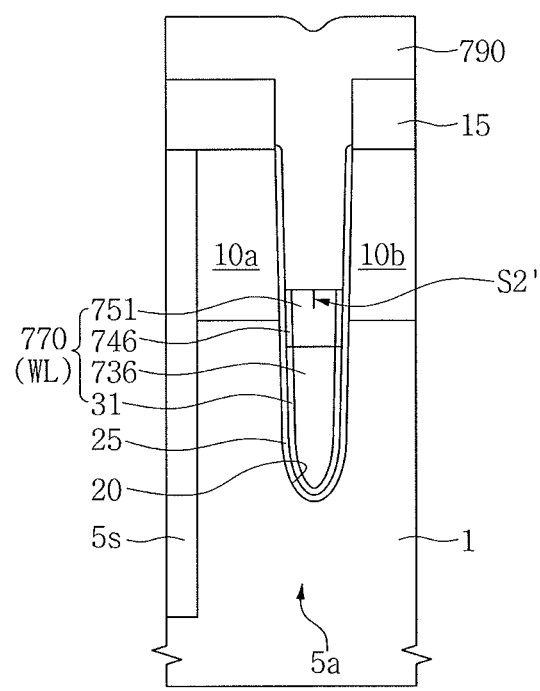
Figure 23A:
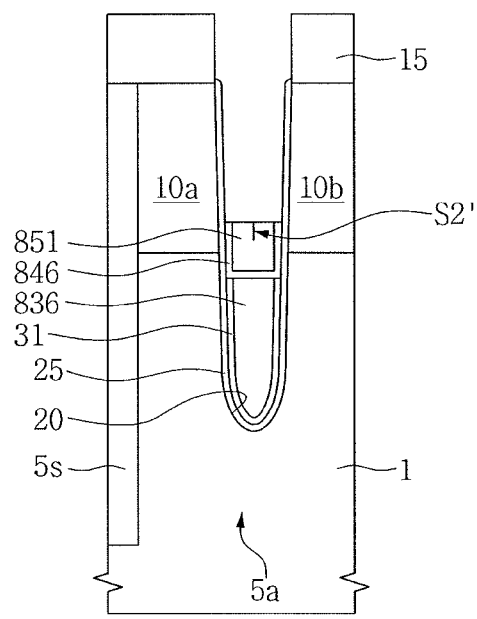
FIGS. 23A to 23C illustrate cross-sectional views showing stages of a method of fabricating a semiconductor device in accordance with still another embodiment.
Figure 23B:
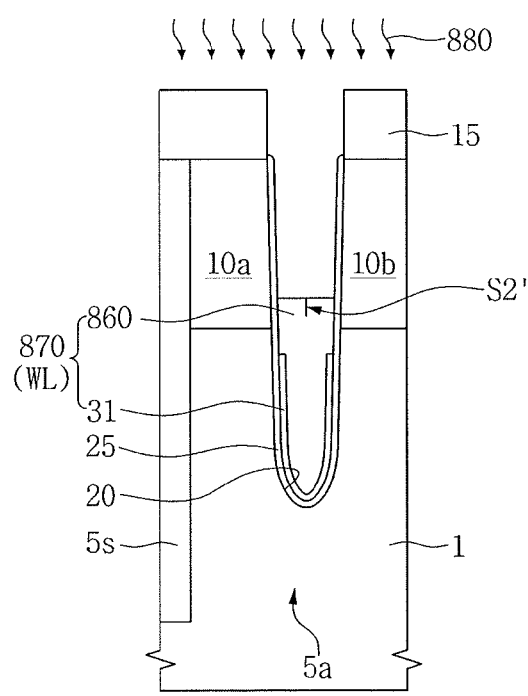
Figure 23C:
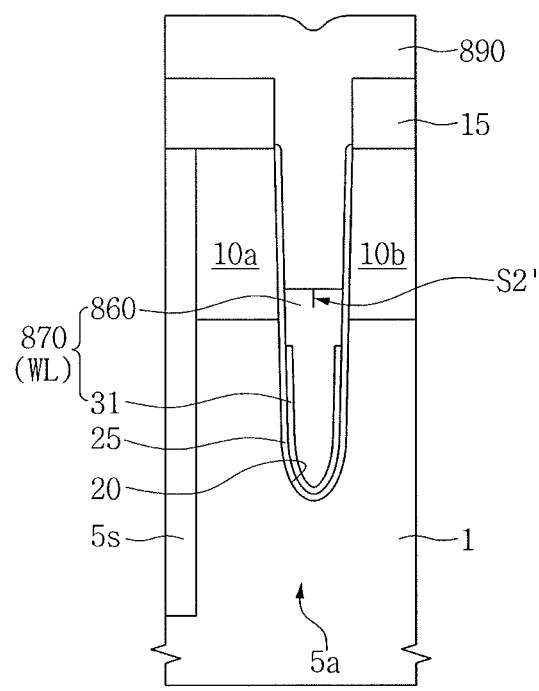
Figure 24A:
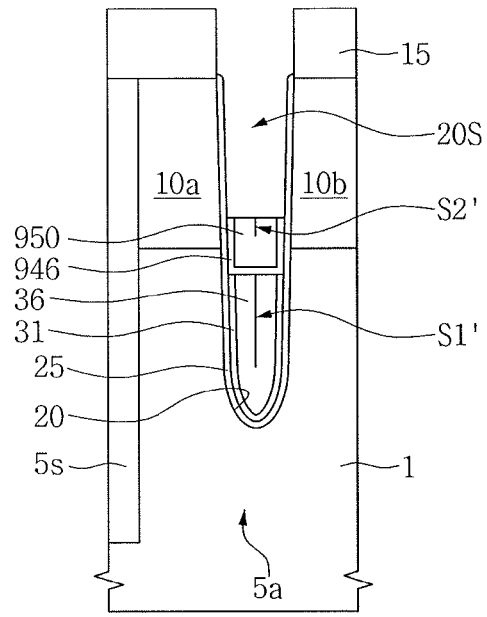
FIGS. 24A to 24C illustrate cross-sectional views showing stages of a method of fabricating a semiconductor device in accordance with still another embodiment.
Figure 24B:
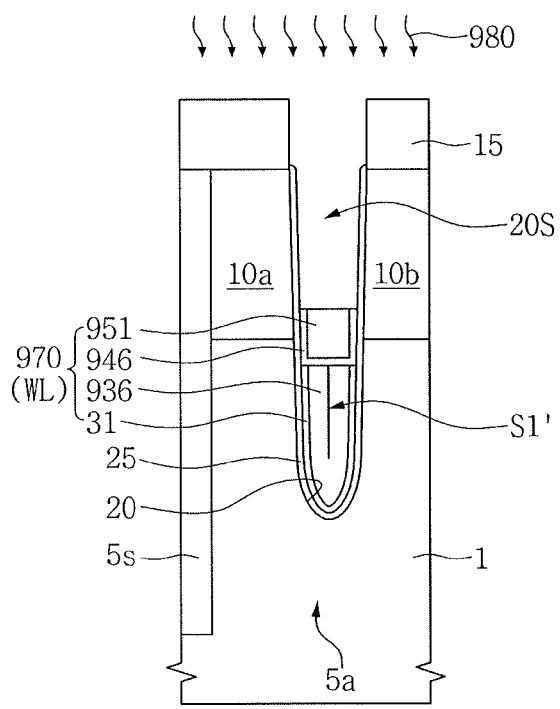
Figure 24C:
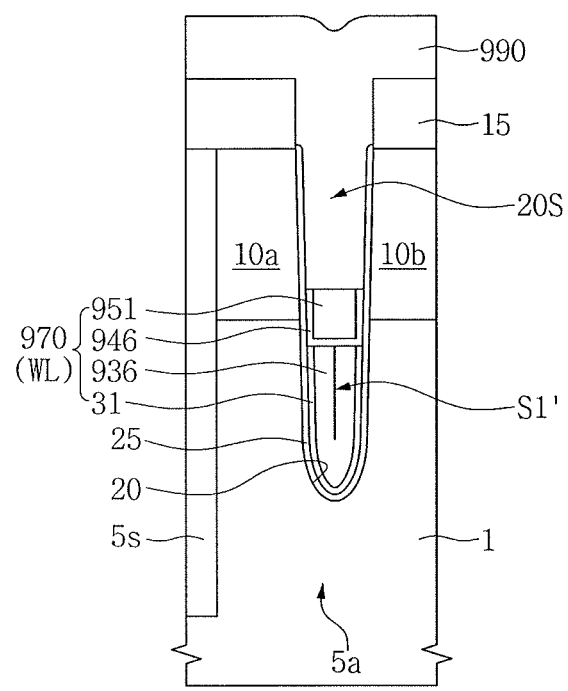
Figure 25A:
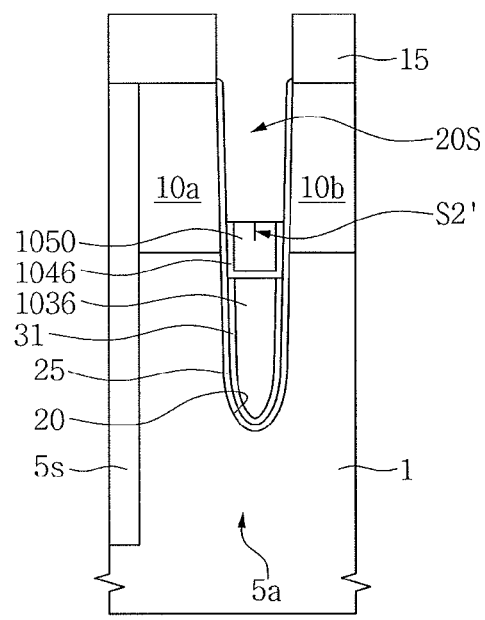
FIGS. 25A to 25C illustrate cross-sectional views showing stages of a method of fabricating a semiconductor device in accordance with still another embodiment.
Figure 25B:
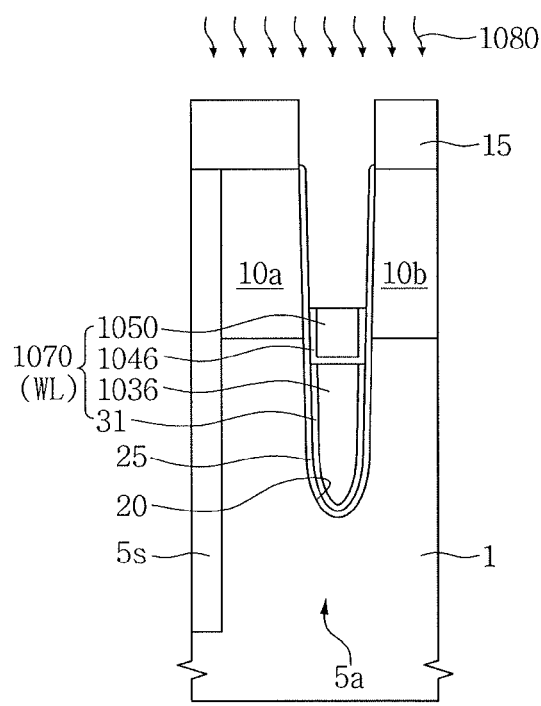
Figure 25C:
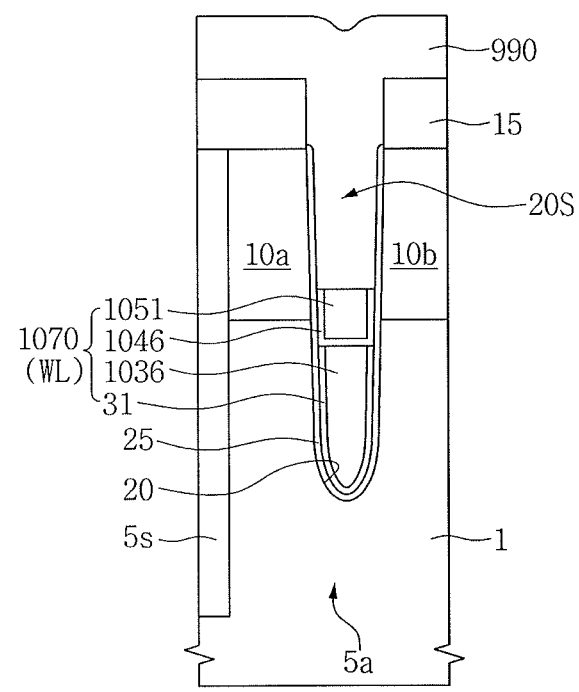
Figure 26A:
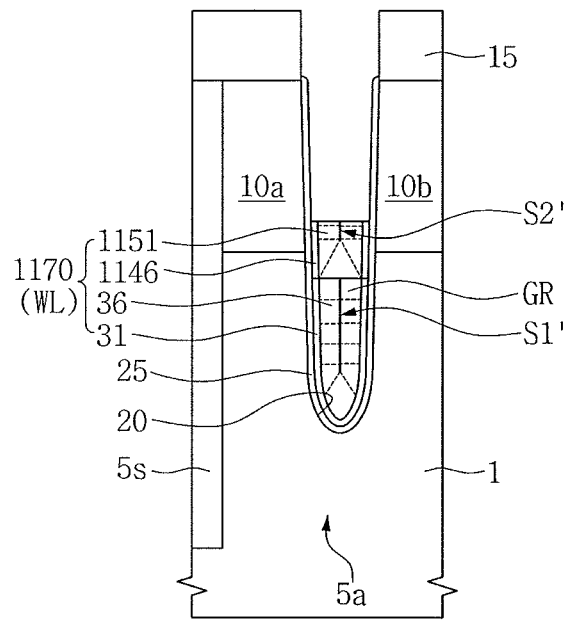
FIGS. 26A to 26C illustrate cross-sectional views showing stages of a method of fabricating a semiconductor device in accordance with still another embodiment.
Figure 26B:
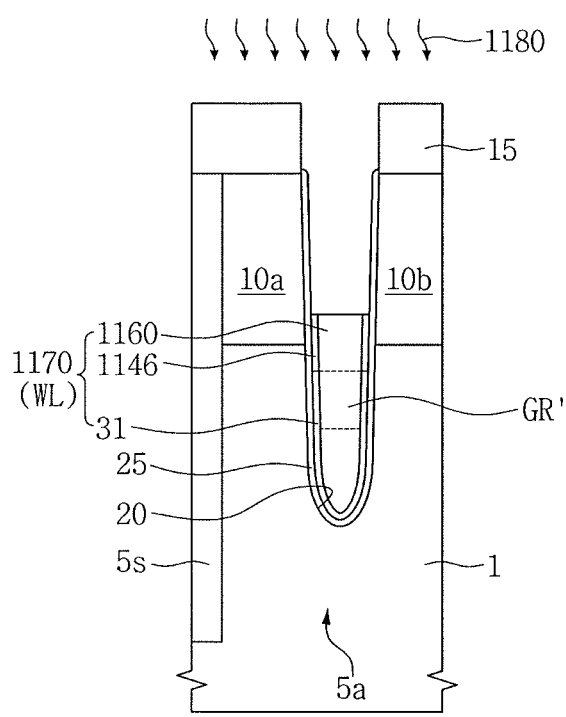
Figure 26C:
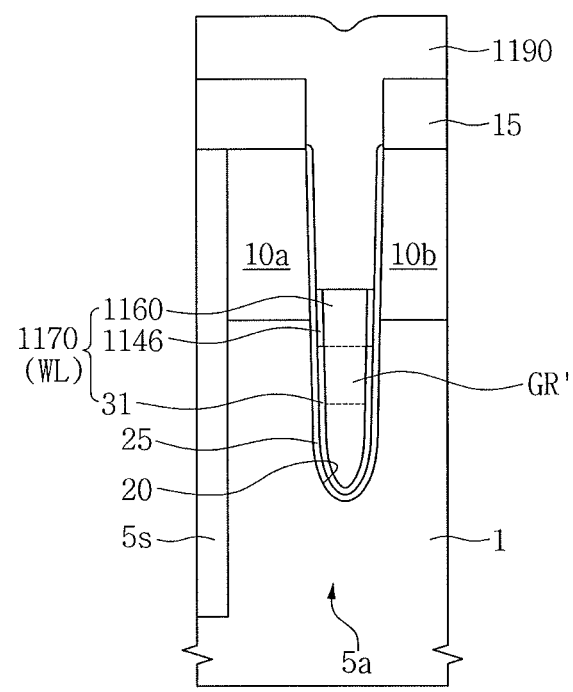

FIGS. 14A to 14H are cross-sectional views showing stages of a method of fabricating a semiconductor device in accordance with an embodiment; FIGS. 15A to 15F are cross-sectional views showing stages of a method of fabricating a semiconductor device in accordance with another embodiment; FIGS. 16A and 16B are cross-sectional views showing stages of a method of fabricating a semiconductor device in accordance with still another embodiment; FIGS. 17A to 17C are cross-sectional views showing stages of a method of fabricating a semiconductor device in accordance with still another embodiment; FIGS. 18A to 18C are cross-sectional views showing stages of a method of fabricating a semiconductor device in accordance with still another embodiment; FIGS. 19A to 19D are cross-sectional views showing stages of a method of fabricating a semiconductor device in accordance with still another embodiment; FIGS. 20A to 20C are cross-sectional views showing stages of a method of fabricating a semiconductor device in accordance with still another embodiment; FIGS. 21A to 21D are cross-sectional views showing stages of a method of fabricating a semiconductor device in accordance with still another embodiment; FIGS. 22A to 22C are cross-sectional views showing stages of a method of fabricating a semiconductor device in accordance with still another embodiment; FIGS. 23A to 23C are cross-sectional views showing stages of a method of fabricating a semiconductor device in accordance with still another embodiment; FIGS. 24A to 24C are cross-sectional views showing stages of a method of fabricating a semiconductor device in accordance with still another embodiment; FIGS. 25A to 25C are cross-sectional views showing stages of a method of fabricating a semiconductor device in accordance with still another embodiment; and FIGS. 26A to 26C are cross-sectional views showing stages of a method of fabricating a semiconductor device in accordance with still another embodiment.

FIGS. 14A to 14H, 15A to 15F, 16A and 16B, 17A to 17C, 18A to 18C, 19A to 19D, 20A to 20C, 21A to 21D, 22A to 22C, 23A to 23C, 24A to 24C, 25A to 25C, and 26A to 26C are cross-sectional views showing an area taken along line I-I' of FIG. 1.

First, referring to FIGS. 14A to 14H together with FIG. 2A, a method of fabricating a semiconductor device in accordance with an embodiment will be described.

Figure 14A:
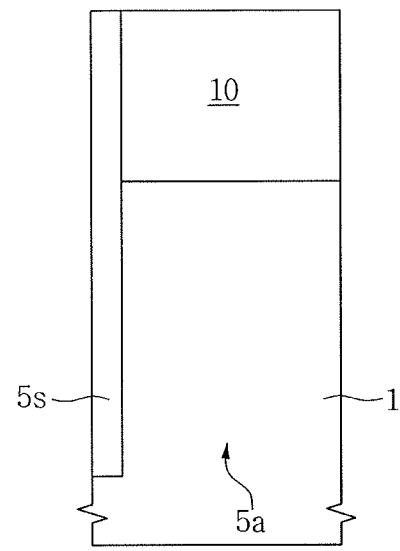
FIGS. 14A to 14H illustrate cross-sectional views showing stages of a method of fabricating a semiconductor device in accordance with an embodiment.

Referring to FIG. 14A, a semiconductor substrate 1 may be provided. The semiconductor substrate 1 may be a substrate formed of a semiconductor material such as silicon. A device isolation region 5s defining an active region 5a may be formed in the semiconductor substrate 1. The device isolation region 5s may be formed by a shallow trench isolation process. The formation of the device isolation region 5s may include forming a device isolation trench in the semiconductor substrate 1 and forming an insulating material layer (e.g., silicon oxide layer) filling the device isolation trench. An impurity region 10 may be formed in the active region 5a by an ion implantation process. The active region 5a may be a first conductivity type, and the impurity region 10 may be a second conductivity type. For example, the active region 5a may have p-type conductivity, and the impurity region 10 may have n-type conductivity.

Figure 14B:
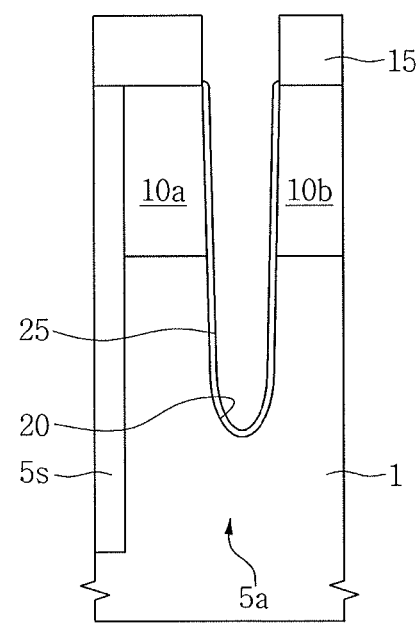

Referring to FIG. 14B, a gate trench 20 may be formed across the active region 5a. The gate trench 20 may cross the active region 5a and extend into the device isolation region 5s. The gate trench 20 may have a bottom surface located in the device isolation region 5s at a lower level than that located in the active region 5a. The formation of the gate trench 20 may include forming a gate mask 15 having an opening that crosses the active region 5a and extends into the device isolation region 5s, and etching the active region 5a and the device isolation region 5s using the gate mask 15 as an etch mask. The gate trench 20 may have a bottom surface located at a lower level than the impurity region 10. The impurity region 10 may be divided into a first source/drain area 10a and a second source/drain area 10b, which are separated by the gate trench 20 and spaced apart from each other.

A gate dielectric layer 25 may be formed on a surface of the active region 5a exposed by the gate trench 20. The gate dielectric layer 25 may be formed on an inner wall of the gate trench 20 crossing the active region 5a. The gate dielectric layer 25 may be formed of an insulating oxide. For example, the gate dielectric layer 25 may be formed of silicon oxide or nitrogen-doped silicon oxide.

Figure 14C:
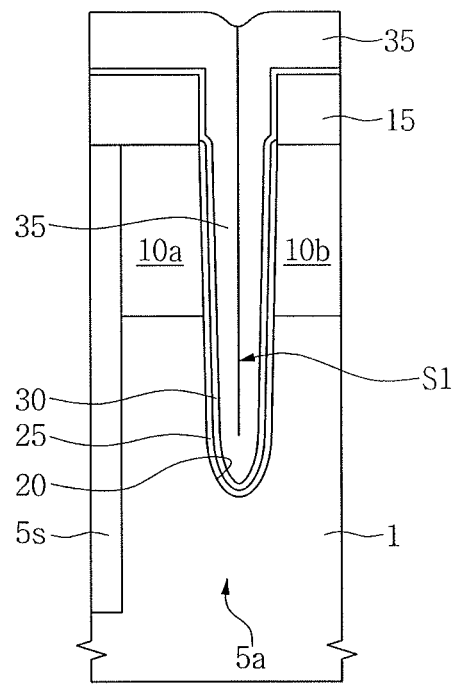

Referring to FIG. 14C, a first barrier conductive layer 30 may be formed on the substrate having the gate dielectric layer 25. The first barrier conductive layer 30 may be conformally formed on the substrate having the gate dielectric layer 25. A first gate conductive layer 35 may be formed on the substrate having the first barrier conductive layer 30. The first gate conductive layer 35 may be formed to fill the gate trench 20 on the first barrier conductive layer 30.

The first gate conductive layer 35 may have a lower seam S1. The lower seam S1 may extend from a center of an upper surface of the first gate conductive layer 35 to the inside thereof. The lower seam S1 may have a line shape that is vertical in a cross-sectional view.

The first gate conductive layer 35 may be formed of a first metal material, and the first barrier conductive layer 30 may be formed of a nitride of a second metal material different from the first metal material. For example, the first gate conductive layer 35 may be formed of W, and the first barrier conductive layer 30 may be formed of a metal nitride such as TiN or TaN. The first gate conductive layer 35 may be formed of W by a chemical vapor deposition process using $WF_6$. The first barrier conductive layer 30 may prevent the gate dielectric layer 25 from being deteriorated by F of the $WF_6$.

Figure 14D:
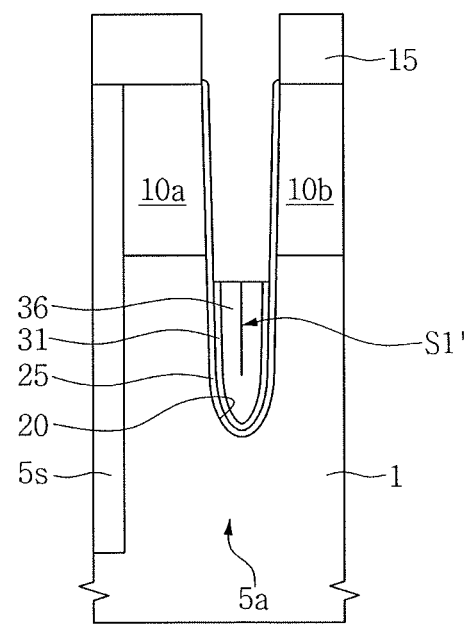

Referring to FIG. 14D, a first gate conductive pattern 36 and a first barrier conductive pattern 31 which partially fill the gate trench 20 may be formed by partially etching the first gate conductive layer 35 and the first barrier conductive layer 30. The first gate conductive pattern 36 may be formed by partially etching the first gate conductive layer 35, and the first barrier conductive pattern 31 may be formed by partially etching the first barrier conductive layer 30. A lower seam S1 may remain in the first gate conductive pattern 36. The first gate conductive pattern 36 and the first barrier conductive pattern 31 may be formed at a lower level than one of the first and second source/drain regions 10a and 10b.

Figure 14E:
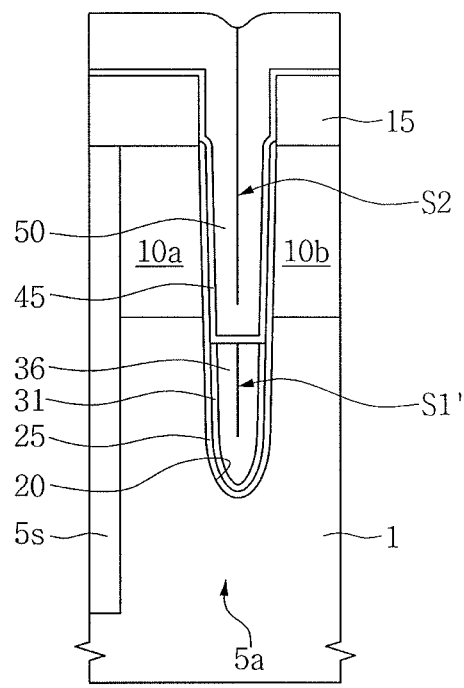

Referring to FIG. 14E, a second barrier conductive layer 45 may be formed on the substrate having the first gate conductive pattern 36 and the first barrier conductive pattern 31. The second barrier conductive layer 45 may be conformally formed on the substrate having the first gate conductive pattern 36 and the first barrier conductive pattern 31. The second barrier conductive layer 45 may be in contact with the first gate conductive pattern 36.

A second gate conductive layer 50 may be formed on the substrate having the second barrier conductive layer 45. The second gate conductive layer 50 may have an upper seam S2. The upper seam S2 may extend from a center of an upper surface of the second gate conductive layer 50 to the inside of the second gate conductive layer 50. The upper seam S2 may be spaced apart from a bottom surface of the second gate conductive layer 50. The upper seam S2 may be a line shape that is vertical.

The first gate conductive pattern 36 and the second gate conductive layer 50 may be formed of a first metal material, and the second barrier conductive layer 45 may be formed of a nitride of the first metal material. For example, the first gate conductive pattern 36 and the second gate conductive layer 50 may be formed of tungsten, and the second barrier conductive layer 45 may be formed of tungsten nitride. The second gate conductive layer 50 may be formed of tungsten by a chemical vapor deposition process using $WF_6$, and the second barrier conductive layer 45 may be formed of tungsten nitride by a chemical vapor deposition process. The second barrier conductive layer 45 may prevent the gate dielectric layer 25 from being deteriorated by F of the $WF_6$ for forming the second gate conductive layer 50

Figure 14F:
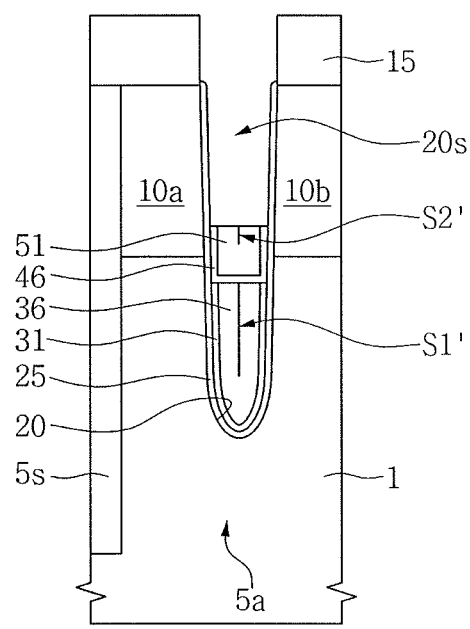

Referring to FIG. 14F, a second gate conductive pattern 51 and a second barrier conductive pattern 46 remaining in the gate trench 20 may be formed by partially etching the second gate conductive layer 50 and the second barrier conductive layer 45. The second gate conductive pattern 51 may be formed by partially etching the second gate conductive layer 50, and the second barrier conductive pattern 46 may be formed by partially etching the second barrier conductive layer 45. An upper seam S2' may remain in the second gate conductive pattern 51. The upper seam S2' may extend from a center of an upper surface of the second gate conductive pattern 51 to the inside of the second gate conductive pattern 51. The upper seam S2' may be spaced apart from a bottom surface of the second gate conductive pattern 51. The second gate conductive pattern 51 and the second barrier conductive pattern 46 may be formed at a lower level than an upper surface of the active region 5a.

Figure 14G:
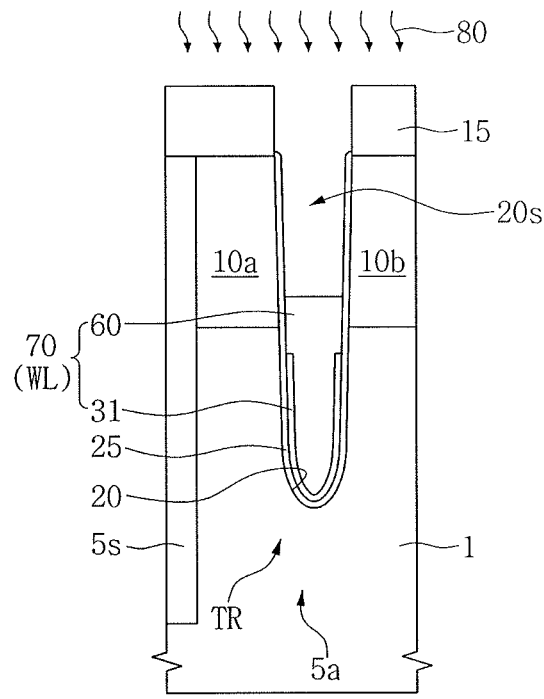

Referring to FIG. 14G, the substrate having the first and second barrier conductive patterns 31 and 46 and first and second gate conductive patterns 36 and 51 may be subjected to a heat treatment 80. In some embodiments, the second barrier conductive pattern 46 may be formed of a metal nitride such as WN.

The heat treatment 80 may be performed at a temperature (e.g., above about 600° C.) at which nitrogen in the second barrier conductive pattern 46 can diffuse. The heat treatment 80 may be performed at a temperature (e.g., about 750° C. to about 1050° C.) at which grains of the first metal material, such as W, of the first and second gate conductive patterns 36 and 51 and second barrier conductive pattern 46 can grow.

Through the heat treatment 80, the grains of the first metal material may grow and resistances of the first and second gate conductive patterns 36 and 51 and second conductive pattern 46 may decrease. Through the heat treatment 80, the grains of tungsten may grow, and the lower and upper seams S1' and S2' located in the first and second gate conductive patterns 36 and 51 may disappear.

By performing the heat treatment 80, nitrogen atoms in the second barrier conductive pattern 46 may diffuse into the first and second gate conductive patterns 36 and 51. By performing the heat treatment 80, the second barrier conductive pattern 46 and the first and second gate conductive patterns 36 and 51 may form a gate conductive pattern 70.

By performing the heat treatment 80, grains of the metal material that forms the second barrier conductive pattern 46 and the first and second gate conductive patterns 36 and 51 may grow, grain boundaries located among the second barrier conductive pattern 46 and the first and second gate conductive patterns 36 and 51 may fade, and thereby the second barrier conductive pattern 46 and the first and second gate conductive patterns 36 and 51 may form a gate conductive pattern 60.

Through the heat treatment 80, the nitrogen atoms in the second barrier conductive pattern 46 may diffuse into the first and second gate conductive patterns 36 and 51, which have lower nitrogen concentrations than the second barrier conductive pattern 46.

In some embodiments, through the heat treatment 80, the nitrogen atoms in the second barrier conductive pattern 46 may diffuse into the first and second gate conductive patterns 36 and 51, and escape to an outside to which the second gate conductive pattern 51 is exposed, that is, an empty space 20s of the gate trench 20.

In some embodiments, some of the nitrogen in the second barrier conductive pattern 46 may remain in the gate conductive pattern 60. Accordingly, the gate conductive pattern 60 may be formed of tungsten containing nitrogen.

When the second barrier conductive pattern 46 is formed of tungsten nitride, and the first and second gate conductive patterns 36 and 51 are formed of tungsten, the gate conductive pattern 60 may be formed of a tungsten material layer or a nitrogen-contained tungsten material layer.

The first barrier conductive pattern 31 and the gate conductive pattern 60 may form the gate electrode 70.

Figure 14H:
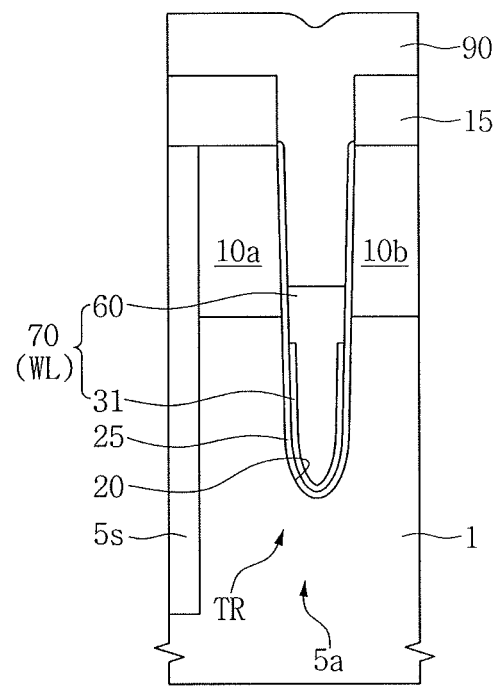

Referring to FIG. 14H, an insulating capping layer 90 may be formed on the substrate having the gate conductive pattern 60. The insulating capping layer 90 may be formed on the substrate having the gate conductive pattern 60 to fill the empty space of the gate trench 20. The insulating capping layer 90 may be formed of an insulating material such as silicon nitride.

Referring again to FIGS. 2A and 2B, an insulating capping pattern 91 may be formed by planarizing the insulating capping layer 90. During the planarization of the insulating capping layer 90, the gate mask 15 may be removed.

Next, referring to FIGS. 15A to 15F together with FIG. 2, a method of fabricating a semiconductor device in accordance with another embodiment will be described.

Figure 15A:
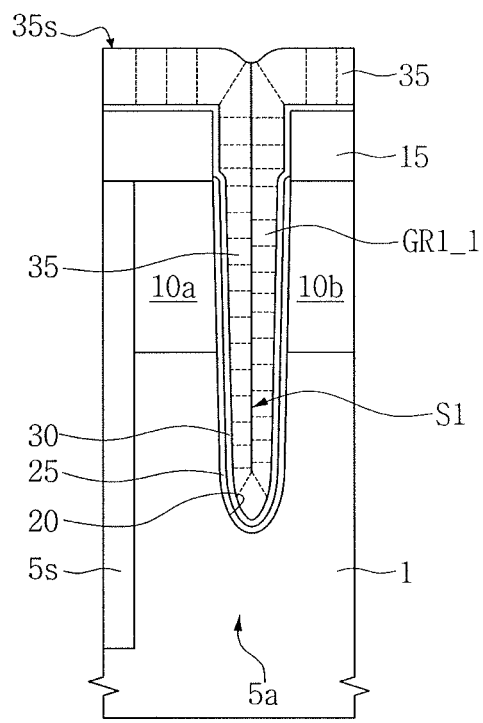
FIGS. 15A to 15F illustrate cross-sectional views showing stages of a method of fabricating a semiconductor device in accordance with another embodiment.

Referring to FIG. 15A, as described in FIGS. 14A and 14B, the gate trench 20 may be formed across the active region 5a of the semiconductor substrate 1, and the gate dielectric layer 25 may be formed on the gate trench 20.

The first barrier conductive layer 30 may be conformally formed on the substrate having the gate dielectric layer 25. A first gate conductive layer 35 may be formed on the first barrier conductive layer 30. The first gate conductive layer 35 may be formed on the first barrier conductive layer 30 and fill the gate trench 20. The first gate conductive layer 35 may be formed of a first metal material (e.g., W), and the first barrier conductive layer 30 may be formed of a nitride (e.g., TiN or TaN) of a second metal material different from the first metal material. The first gate conductive layer 35 may have a seam S1 thereinside. The seam S1 may extend from a center of an upper surface of the first gate conductive layer 35 to the inside of the first gate conductive layer 35. The seam S1 may be a line shape that is vertical. The first gate conductive layer 35 may have a plurality of grains GR1_1. The grains GR1_1 in the first gate conductive layer 35 may be arranged with the seam S1 therebetween. The first gate conductive layer 35 may have a curved upper surface 35s. For example, the upper surface 35s of the first gate conductive layer 35 may have a part located at a lower level on the gate trench 20 than on the gate mask 15.

Figure 15B:
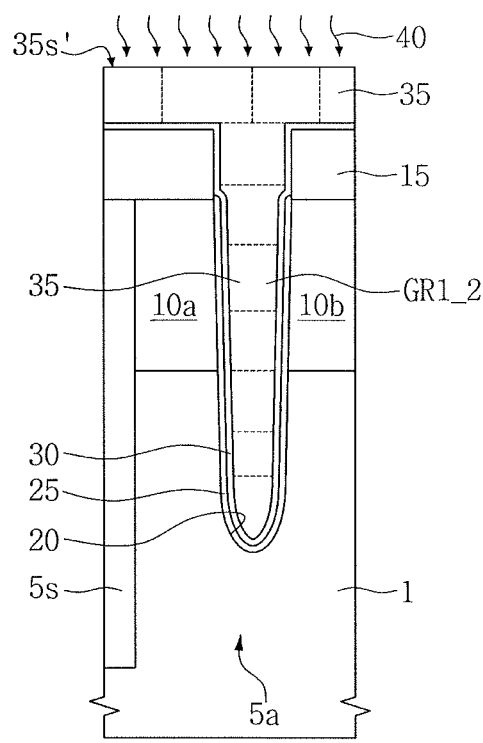

Referring to FIG. 15B, the substrate having the first barrier conductive layer 30 and the first gate conductive layer 35 may be subjected to a first heat treatment 40. The first heat treatment 40 may be performed at a temperature at which grains of the first metal material of the first gate conductive layer 35 such as tungsten can grow (e.g., about 750° C. to about 1050° C.).

Through the first heat treatment 40, the first gate conductive layer 35 may have a substantially flattened upper surface 35s'. Through the first heat treatment 40, the seam S1 may be removed due to growth of the grains GR1_1 of the first gate conductive layer 35. Accordingly, grains GR1_2 of the first gate conductive layer 35 after the first heat treatment 40 may be greater than the grains GR1_1 of the first gate conductive layer 35 before the first heat treatment 40.

Figure 15C:
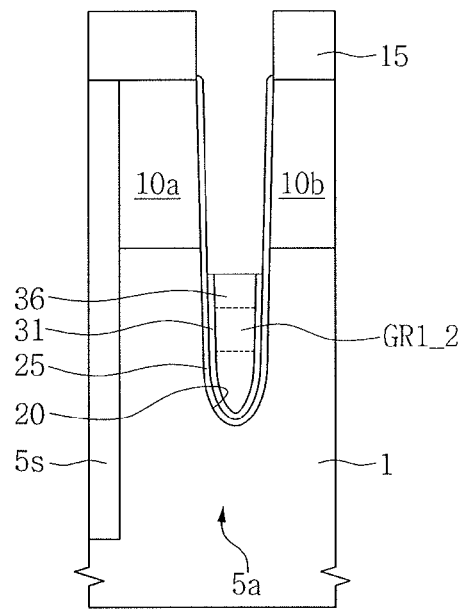

Referring to FIG. 15C, a first gate conductive pattern 36 may be formed by partially etching the first gate conductive layer 35 planarized due to the first heat treatment 40. A first barrier conductive pattern 31 may be formed by partially etching the first barrier conductive layer 30. The first barrier conductive pattern 31 may be formed between the first gate conductive pattern 36 and the gate dielectric layer 25.

Figure 15D:
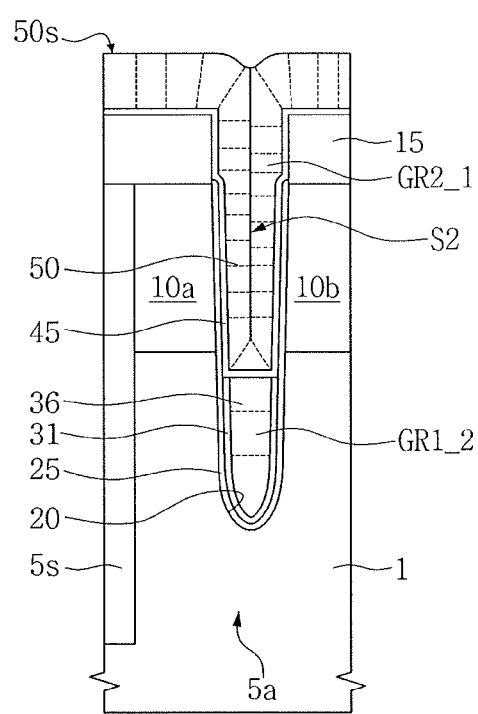

Referring to FIG. 15D, a second barrier conductive layer 45 may be conformally formed on the substrate having the first barrier conductive pattern 31 and the first gate conductive pattern 36. A second gate conductive layer 50 may be formed on the second barrier conductive layer 45. The second gate conductive layer 50 may have grains GR2_1. The second gate conductive layer 50 may have an upper seam S2. The second gate conductive layer 50 may have a curved upper surface 50s.

The first gate conductive pattern 36 and the second gate conductive layer 50 may be formed of a first metal material such as tungsten, the second barrier conductive layer 45 may be formed of a nitride of the first metal material such as WN, and the first barrier conductive pattern 31 may be formed of a nitride of a second metal material, such as TiN or TaN, different from the first metal material.

Figure 15E:
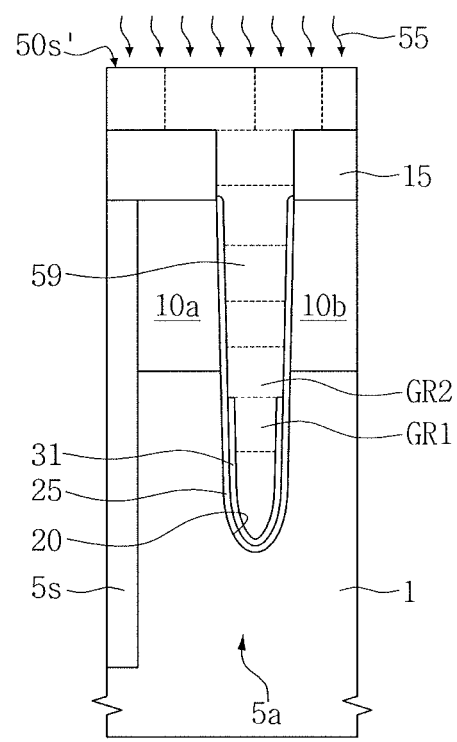

Referring to FIG. 15E, the substrate having the second gate conductive layer 50 and the second barrier conductive layer 45a may be subjected to a second heat treatment 55. The second heat treatment 55 may be performed at a temperature of about 750° C. to about 1050° C.

Through the second heat treatment 55, the second gate conductive layer 50 may have a substantially flattened upper surface 50s'. Through the second heat treatment 55, grains GR2_1 of the second gate conductive layer 50 may grow to be a larger grain GR2_2. Through second heat treatment 55, the grain GR2_1 of the second gate conductive layer 50 may grow, and thereby the upper seam S2 may be removed.

By performing the second heat treatment 55, nitrogen atoms in the second barrier conductive layer 45 may diffuse into the first gate conductive pattern 36 and second gate conductive layer 50 having lower nitrogen concentrations than the second barrier conductive layer 45.

By performing the second heat treatment 55, the nitrogen atoms in the second barrier conductive layer 45 may begin to diffuse into the first gate conductive pattern 36 and second gate conductive layer 50 having lower nitrogen concentrations than the second barrier conductive layer 45 and escape to the outside of the second gate conductive layer 50 as the heat treatment time progresses.

By performing the second heat treatment 55, the second barrier conductive layer 45, the first gate conductive pattern 36, and the second gate conductive layer 50 may form a gate conductive layer 59.

By performing the second heat treatment 55, grains GR1 and GR2 of a metal material forming the second barrier conductive layer 45, first gate conductive pattern 36, and second gate conductive layer 50 may grow, boundaries among the second barrier conductive layer 45, the first gate conductive pattern 36, and the second gate conductive layer 50 may fade, and thereby the second barrier conductive layer 45, the first gate conductive pattern 36, and the second gate conductive layer 50 may form the gate conductive layer 59. As the sizes of the grains GR1 and GR2 become larger, the resistance of the gate conductive layer 59 may decrease.

Figure 15F:
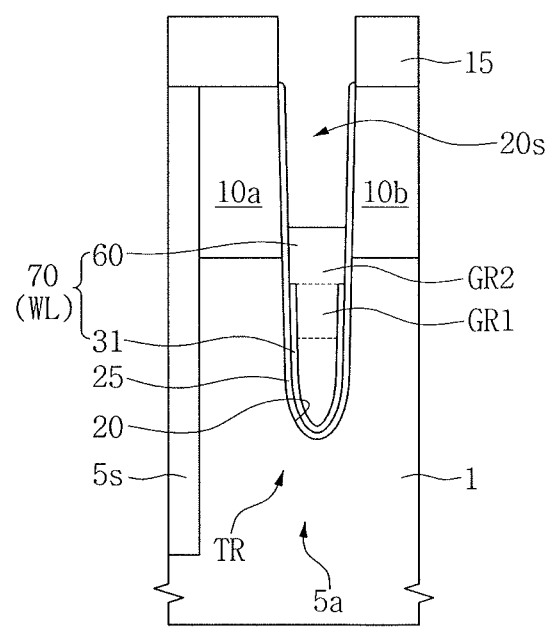

Referring to FIG. 15F, a gate conductive pattern 60 may be formed by partially etching the gate conductive layer 59. The gate conductive pattern 60 and the first barrier conductive pattern 31 may form a gate electrode 70. Next, an insulating capping pattern may be formed on the gate electrode 70 by forming an insulating capping layer on the substrate having the gate electrode 70 and planarizing the insulating capping layer.

Next, referring to FIGS. 16A and 16B together with FIG. 3, a method of fabricating a semiconductor device in accordance with still another embodiment will be described.

Referring to FIG. 16A, as described in FIGS. 14A and 14B, the gate trench 20 may be formed across the active region 5a of the semiconductor substrate 1, and the gate dielectric layer 25 may be formed on the gate trench 20.

A first barrier conductive layer may be conformally formed on the substrate having the gate dielectric layer 25, and a first gate conductive layer may be formed on the first barrier conductive layer. A first barrier conductive pattern 31 and a first gate conductive pattern 36 may be formed on the substrate having the gate dielectric layer 25 by partially etching the first gate conductive layer and the first barrier conductive layer. The first gate conductive pattern 36 may have a lower seam S1'. The first barrier conductive pattern 31 may surround side and bottom surfaces of the first gate conductive pattern 36 and may be formed between the first gate conductive pattern 36 and the gate dielectric layer 25. A second barrier conductive layer may be conformally formed on the substrate having the first gate conductive pattern 36 and the first barrier conductive pattern 31, and a second gate conductive layer may be formed on the second barrier conductive layer. A second barrier conductive pattern 146 and a second gate conductive pattern 151 may be formed by partially etching the second gate conductive layer and the second barrier conductive layer. The second gate conductive pattern 151 may have an upper seam S2'.

The first and second barrier conductive patterns 31 and 146 and the first and second gate conductive patterns 36 and 151 may form a gate electrode 170.

In some embodiments, the first and second gate conductive patterns 36 and 151 may be formed of a first metal material, the first barrier conductive pattern 31 may be formed of a nitride of a second metal material different from the first metal material, and the second barrier conductive pattern 146 may be formed of a nitride or carbide of the first metal material. For example, the first and second gate conductive patterns 36 and 151 may be formed of tungsten, the first barrier conductive pattern 31 may be formed of TiN or TaN, and the second barrier conductive pattern 146 may be formed of WN or WC. When the second barrier conductive pattern 146 is formed of WC, the second barrier conductive pattern 146 may be formed by a MOCVD process. The second barrier conductive pattern 146 may be formed of an amorphous-structured $WC_x$. Here, "x" may be a value from about 1 to about 3.

Referring to FIG. 16B, an insulating capping layer 190 may be formed on the substrate having the second barrier conductive pattern 46 and the second gate conductive pattern 51.

Referring again to FIG. 3, an insulating capping pattern 191 may be formed by planarizing the insulating capping layer 190. During the planarization of the insulating capping layer 190, the gate mask 15 may be removed.

Next, referring to FIGS. 17A to 17C together with FIG. 4, a method of fabricating a semiconductor device in accordance with still another embodiment will be described.

Referring to FIG. 17A, as described in FIGS. 14A to 14D, the gate trench 20 may be formed across the active region 5a of the semiconductor substrate 1, the gate dielectric layer 25 may be formed on the gate trench 20, and the first barrier conductive pattern 31 and the first gate conductive pattern 36 may be formed on the gate dielectric layer 25. The first gate conductive pattern 36 may have a lower seam S1'.

A second barrier conductive layer 245 may be formed on the substrate having the first barrier conductive pattern 31 and the first gate conductive pattern 36. The first gate conductive pattern 36 may be formed of a first metal material such as W, the second barrier conductive layer 245 may be formed of a nitride (e.g., WN) or carbide (e.g., WC) of the first metal material.

Referring to FIG. 17B, a second barrier conductive spacer may be formed by anisotropically etching the second barrier conductive layer 245. A second gate conductive layer may be formed on the substrate having the second barrier conductive spacer. The second gate conductive layer may have an upper seam extending from a center of an upper surface to the inside thereof. A second gate conductive pattern 251 and a second barrier conductive pattern 246 may be formed by partially etching the second gate conductive layer and the second barrier conductive spacer. The second gate conductive pattern 251 may have a remaining upper seam S2'. The second gate conductive pattern 251 may be in contact with the first gate conductive pattern 36. The second barrier conductive pattern 246 may be interposed between the second gate conductive pattern 251 and the gate dielectric layer 25. The first and second gate conductive patterns 36 and 251 and the first and second barrier conductive patterns 31 and 246 may form a gate electrode 270.

Referring to FIG. 17C, an insulating capping layer 290 may be formed on the substrate having the gate electrode 270.

Next, referring again to FIG. 4, an insulating capping pattern 291 may be formed by planarizing the insulating capping layer 290. During the planarization of the insulating capping layer 290, the gate mask 15 may be removed.

Next, referring to FIGS. 18A to 18C together with FIG. 5, a method of fabricating a semiconductor device in accordance with still another embodiment will be described.

Referring to FIG. 18A, as described in FIGS. 14A to 14D, the gate trench 20 may be formed across the active region 5a of the semiconductor substrate 1, the gate dielectric layer 25 may be formed on the gate trench 20, and the first barrier conductive pattern 31 and the first gate conductive pattern 36 may be formed on the gate dielectric layer 25. The first gate conductive pattern 36 may have a lower seam S1.

A second barrier conductive layer may be conformally formed on the substrate having the first barrier conductive pattern 31 and the first gate conductive pattern 36, and a second gate conductive layer may be formed on the second barrier conductive layer.

The second barrier conductive pattern 346 and the second gate conductive pattern 351 may be formed by partially etching the second gate conductive layer and the second barrier conductive layer. The second gate conductive pattern 351 may have an upper seam S2'.

The second barrier conductive pattern 346 may be formed between the second gate conductive pattern 351 and the first gate conductive pattern 36, and between the second gate conductive pattern 351 and the gate dielectric layer 25.

The first and second gate conductive patterns 36 and 351 may be formed of a first metal material such as W, the second barrier conductive pattern 346 may be formed of a nitride of the first metal material such as WN, and the first barrier conductive pattern 31 may be formed of a nitride of a second metal material, such as TiN or TaN, different from the first metal material.

Referring to FIGS. 18B and 18C, the substrate having the second barrier conductive pattern 346 and the second gate conductive pattern 351 may be exposed to a first temperature atmosphere 380. Then, an insulating capping layer 390 may be formed on the substrate having the second barrier conductive pattern 346 and second gate conductive pattern 351 at the first temperature atmosphere 380. The first temperature atmosphere 380 may be a temperature atmosphere at which nitrogen in the second barrier conductive pattern 346 can diffuse, that is, a temperature of above 600° C. Accordingly, the nitrogen in the second barrier conductive pattern 346 may diffuse into the first and second gate conductive patterns 36 and 351, as the insulating capping layer 390 is formed.

The second barrier conductive pattern 346 and the first and second gate conductive patterns 36 and 351 may commonly include the first metal material. Accordingly, the second barrier conductive pattern 346 and the first and second gate conductive patterns 36 and 351 may form a gate conductive pattern 360 having the first metal material. The gate conductive pattern 360 may include a lower seam S1' and an upper seam S2'. The lower seam S1' and the upper seam S2' may be spaced apart from each other.

In some embodiments, the gate conductive pattern 360 may include nitrogen thereinside. Accordingly, the gate conductive pattern 360 may be formed of W including nitrogen.

The gate conductive pattern 360 and the first barrier conductive pattern 31 may form a gate electrode 370.

Referring again to FIG. 5, an insulating capping pattern 391 may be formed by planarizing the insulating capping layer 390. During the planarization of the insulating capping layer 390, the gate mask 15 may be removed.

Next, referring to FIGS. 19A to 19D together with FIG. 6, a method of fabricating a semiconductor device in accordance with still another embodiment will be described.

Figure 19A:
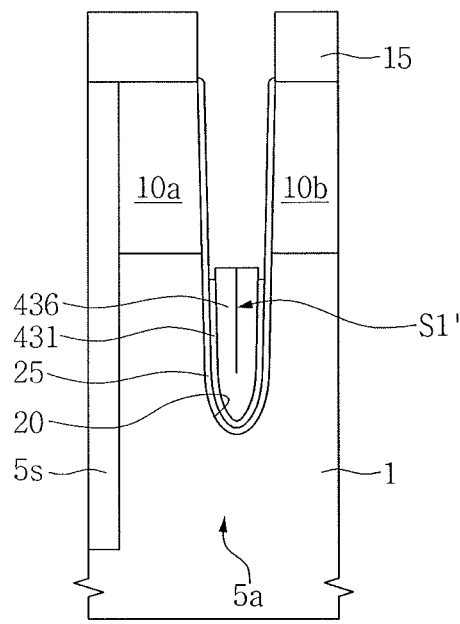
FIGS. 19A to 19D illustrate cross-sectional views showing stages of a method of fabricating a semiconductor device in accordance with still another embodiment.
Figure 20A:
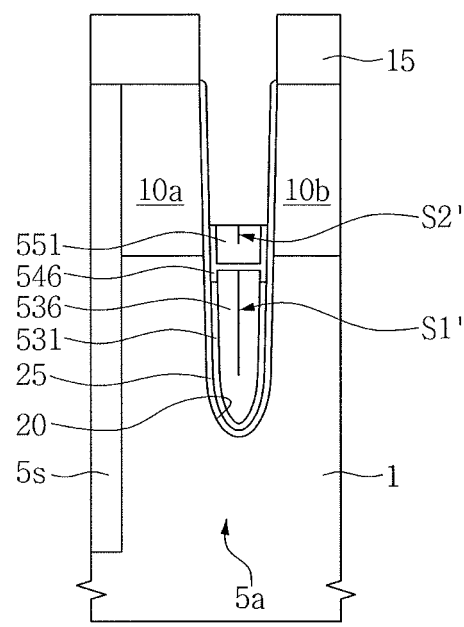
FIGS. 20A to 20C illustrate cross-sectional views showing stages of a method of fabricating a semiconductor device in accordance with still another embodiment.
Figure 20B:
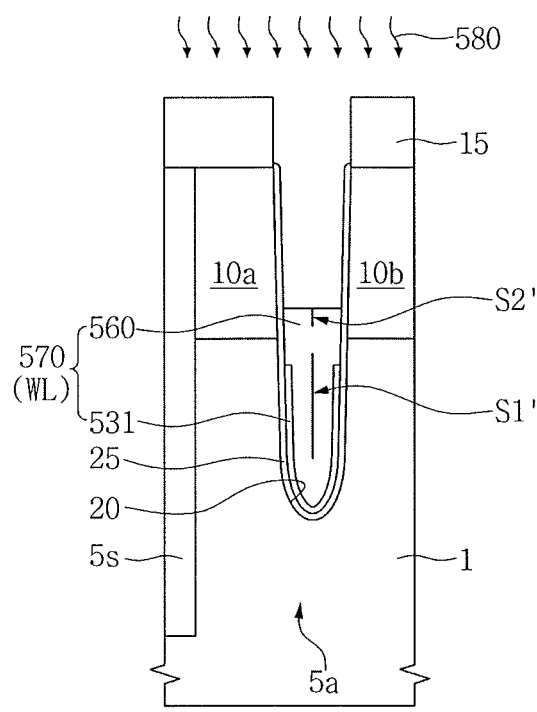
Figure 20C:
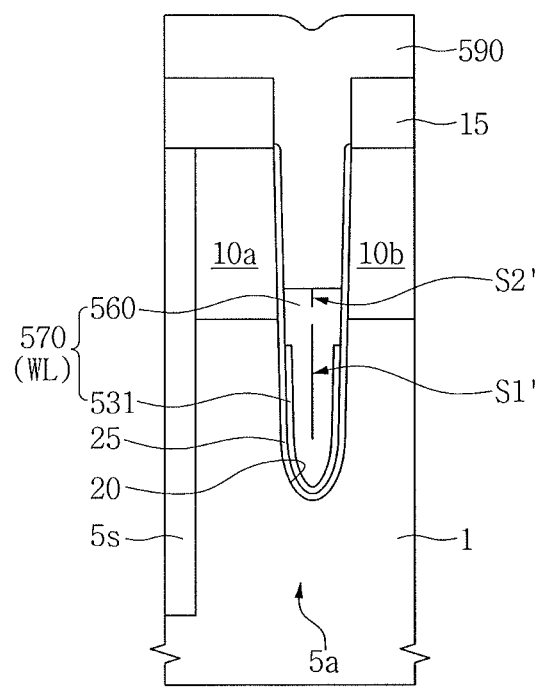

Referring to FIGS. 1 and 19A, as described in FIGS. 14A and 14B, the gate trench 20 may be formed across the active region 5a of the semiconductor substrate 1, and the gate dielectric layer 25 may be formed on the gate trench 20. Then, as described in FIG. 14C, a first barrier conductive layer may be conformally formed on the substrate having the gate dielectric layer 25, and a first gate conductive layer filling the gate trench 20 may be formed on the first barrier conductive layer.

A first gate conductive pattern 436 and a first barrier conductive pattern 431 may be formed by partially etching the first gate conductive layer and the first barrier conductive layer. The first barrier conductive pattern 431 may be interposed between the first gate conductive pattern 436 and the gate dielectric layer 25, and have an upper surface located at a lower level than an upper surface of the first gate conductive pattern 436. The first gate conductive pattern 436 may have a lower seam S1'. The lower seam S1' may extend from a center of the upper surface of the first gate conductive pattern 436 to the inside of the first gate conductive pattern 436. The upper end of the lower seam S1' may be formed at a higher level than the first barrier conductive pattern 431.

Figure 19B:
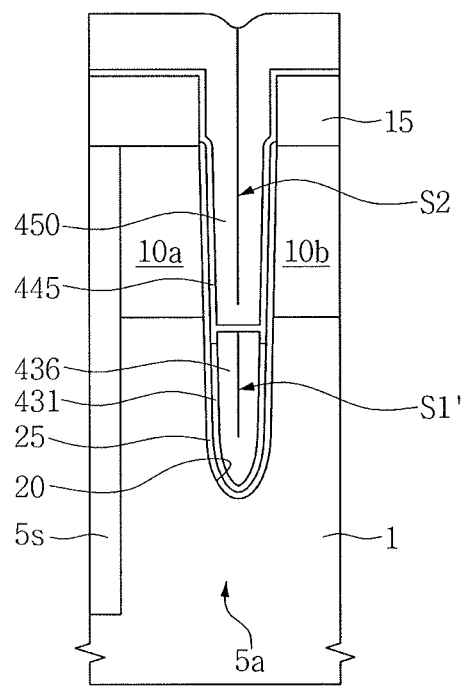

Referring to FIG. 19B, a second barrier conductive layer 445 and a second gate conductive layer 450 may be formed on the substrate having the first gate conductive pattern 436 and first barrier conductive pattern 431. The second gate conductive layer 450 may have an upper seam S2 vertically extending from a center of an upper surface to the inside thereof.

The first gate conductive pattern 436 and the second gate conductive layer 450 may be formed of a first metal material such as W, the second barrier conductive layer 445 may be formed of a nitride (e.g., WN. etc.) or carbide (e.g., WC, etc.) of the first metal material, and the first barrier conductive pattern 431 may be formed of a nitride (e.g., TiN or TaN) of a second metal material different from the first metal material.

Figure 19C:
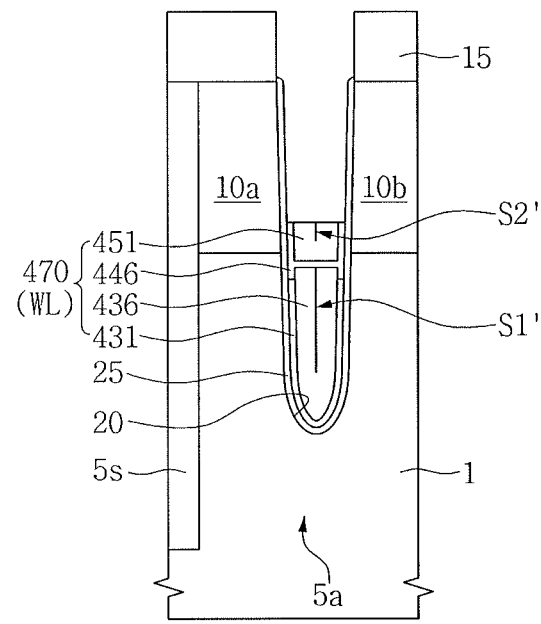

Referring to FIG. 19C, a second gate conductive pattern 451 and a second barrier conductive pattern 446 may be formed by partially etching the second gate conductive layer 450 and the second barrier conductive layer 445. The second gate conductive pattern 451 may be formed on the first gate conductive pattern 436. The upper seam S2' may remain in the second gate conductive pattern 451. The lower seam l' and the upper seam S2' may be spaced apart from each other. The second barrier conductive pattern 451 may include a part interposed between the first and second gate conductive patterns 436 and 451, a part interposed between the second gate conductive pattern 451 and the gate dielectric layer 25, and a part interposed between the first gate conductive pattern 436 and the gate dielectric layer 25.

The first and second gate conductive patterns 436 and 451, and the first and second barrier conductive patterns 431 and 451 may form a gate electrode 470.

Figure 19D:
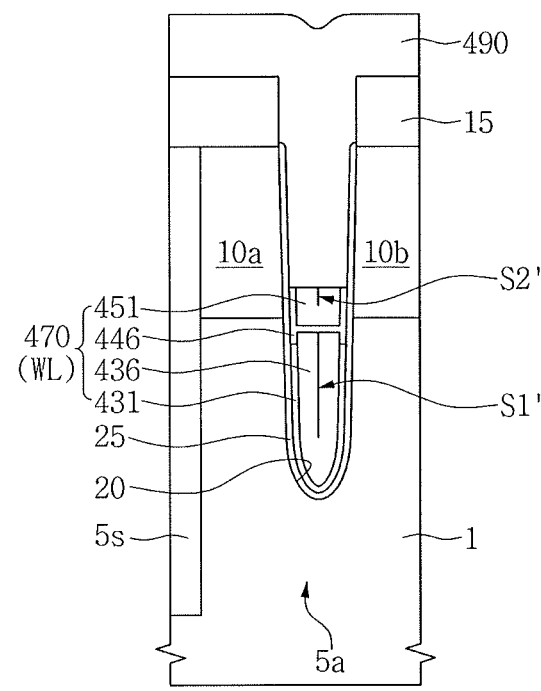

Referring to FIG. 19D, an insulating capping layer 490 may be formed on the substrate having the gate electrode 470.

Referring again to FIG. 6, an insulating capping pattern 491 may be formed by planarizing the insulating capping layer 490. During the planarization of the insulating capping layer 490, the gate mask 15 may be removed.

Next, referring to FIGS. 20A to 20C together with FIG. 7, a method of fabricating a semiconductor device in accordance with still another embodiment will be described.

Referring to FIG. 20A, as described in FIGS. 14A and 14B, the gate trench 20 may be formed across the active region 5a of the semiconductor substrate 1, and the gate dielectric layer 25 may be formed on the gate trench 20.

Next, as described in FIG. 14C, a first barrier conductive layer may be conformally formed on the substrate having the gate dielectric layer 25, and a first gate conductive layer filling the gate trench 20 may be formed on the first barrier conductive layer.

A first gate conductive pattern 536 and a first barrier conductive pattern 531 may be formed by partially etching the first gate conductive layer and the first barrier conductive layer. The first barrier conductive pattern 531 may be interposed between the first gate conductive pattern 536 and the gate dielectric layer 25, and have an upper surface located at a lower level than an upper surface of the first gate conductive pattern 536. The first gate conductive pattern 536 may have a lower seam S1'. The lower seam S1' may extend from a center of the upper surface of the first gate conductive pattern 536 to the inside of the first gate conductive pattern 536. The upper end of the lower seam S1' may be formed at a higher level than the first barrier conductive pattern 531.

A second barrier conductive layer may be conformally formed on the substrate having the first gate conductive pattern 536 and the first barrier conductive pattern 531, and a second gate conductive layer may be formed on the second barrier conductive layer. The second gate conductive layer may have an upper seam S2' vertically extending from a center of an upper surface to the inside thereof. A second gate conductive pattern 551 and a second barrier conductive pattern 546 may be formed by partially etching the second gate conductive layer and the second barrier conductive layer. The second gate conductive pattern 551 may be formed on the first gate conductive pattern 536. The upper seam S2' may remain in the second gate conductive pattern 551. The lower seam S1' and the upper seam S2' may be spaced apart from each other. The second barrier conductive pattern 546 may have a part interposed between the first and second gate conductive patterns 536 and 551, a part interposed between the second gate conductive pattern 551 and the gate dielectric layer 25, and a part interposed between the first gate conductive pattern 536 and the gate dielectric layer 25. The first and second gate conductive patterns 536 and 551 may be formed of a first metal material such as W. The second barrier conductive pattern 546 may be formed of a nitride (e.g., WN, etc.) of the first metal material, and the first barrier conductive pattern 531 may be formed of a nitride (e.g., TiN or TaN, etc.) of a second metal material different from the first metal material.

Referring to FIGS. 20B and 20C, the substrate having the first and second gate conductive patterns 536 and 551, and first and second barrier conductive patterns 531 and 546 may be exposed to a first temperature atmosphere 580. Sequentially, an insulating capping layer 590 may be formed on the substrate having the first and second gate conductive patterns 536 and 551, and the first and second barrier conductive patterns 531 and 546 in the first temperature atmosphere 580. The first temperature atmosphere 580 may be a temperature atmosphere at which nitrogen in the second barrier conductive pattern 546 can diffuse. Accordingly, during the formation of the insulating capping layer 590, the nitrogen in the second barrier conductive pattern 546 may diffuse into the first and second gate conductive patterns 536 and 551.

The first and second gate conductive patterns 536 and 551, and the second barrier conductive pattern 546 may form a gate conductive pattern 560. The gate conductive pattern 560 may be formed of a tungsten including nitrogen. The gate conductive pattern 560 and the first barrier conductive pattern 531 may form a gate electrode 570.

Referring again to FIG. 7, an insulating capping pattern 591 may be formed by planarizing the insulating capping layer 590. During the planarization of the insulating capping layer 590, the gate mask 15 may be removed.

Next, referring to FIGS. 21A to 21D together with FIG. 8, a method of fabricating a semiconductor device in accordance with still another embodiment will be described.

Figure 21A:
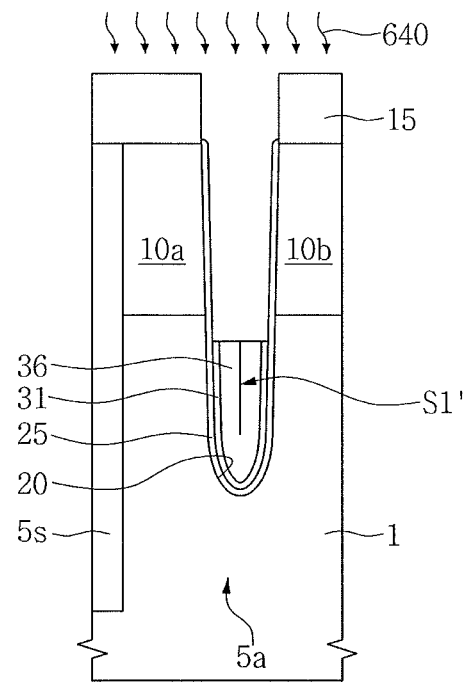
FIGS. 21A to 21D illustrate cross-sectional views showing stages of a method of fabricating a semiconductor device in accordance with still another embodiment.

Referring to FIG. 21A, as described in FIGS. 14A and 14B, the gate trench 20 may be formed across the active region 5a of the semiconductor substrate 1, and the gate dielectric layer 25 may be formed on the gate trench 20. In addition, first and second source/drain regions 10a and 10b may be formed in the active region 5a located at both sides of the gate trench 20.

Next, as described in FIG. 14C, a first barrier conductive layer may be conformally formed on the substrate having the gate dielectric layer 25, and a first gate conductive layer filling the gate trench 20 may be formed on the first barrier conductive layer.

A first gate conductive pattern 36 and a first barrier conductive pattern 31 may be formed by partially etching the first gate conductive layer and the first barrier conductive layer. The first barrier conductive pattern 31 may be interposed between the first gate conductive pattern 36 and the gate dielectric layer 25. The first gate conductive pattern 36 may have a lower seam S1'.

Figure 21B:
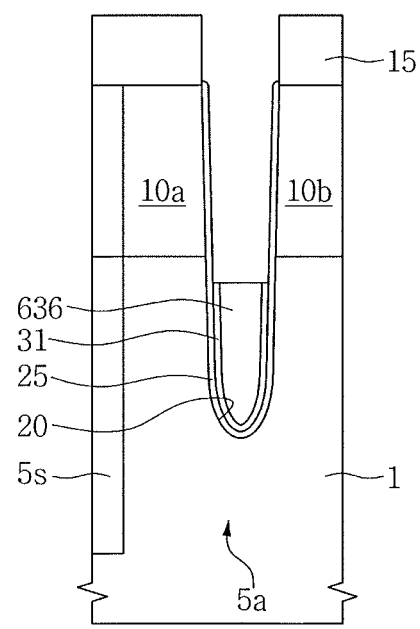

Referring to FIGS. 21A and 21B, the substrate having the first gate conductive pattern 36 and the first barrier conductive pattern 31 may be subjected to a heat treatment 640. The heat treatment 640 may remove the lower seam S1' located in the first gate conductive pattern 36 and cause grains of the first gate conductive pattern 36 to grow. For example, the heat treatment 640 may be performed at a temperature, for example, above about 750° C. at which grains of a metal material of the first gate conductive pattern 36, for example, grains of tungsten, can grow. Accordingly, a first gate conductive pattern 636 of which the resistance decreased due to the grain growth may be formed.

Figure 21C:
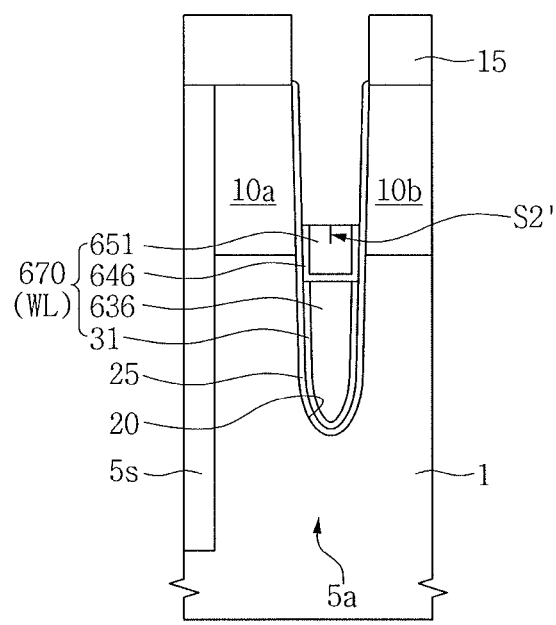

Referring to FIG. 21C, a second barrier conductive layer may be conformally formed on the substrate having the first gate conductive pattern 636, and a second gate conductive layer may be formed on the second barrier conductive layer. A second gate conductive pattern 651 and a second barrier conductive pattern 646 may be formed by partially etching the second gate conductive layer and the second barrier conductive layer. The second gate conductive pattern 651 may have an upper seam S2'. The first and second gate conductive patterns 636 and 651, and the first and second barrier conductive patterns 31 and 646 may form a gate electrode 670.

Figure 21D:
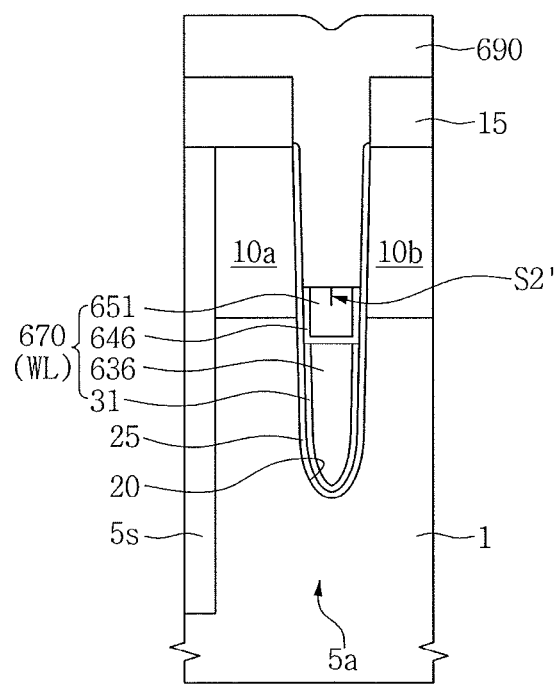

Referring to FIG. 21D, an insulating capping layer 690 may be formed on the substrate having the gate electrode 670.

Referring again to FIG. 8, an insulating capping pattern 691 may be formed by planarizing the insulating capping layer 690. During the planarization of the insulating capping layer 690, the gate mask 15 may be removed.

Next, referring to FIGS. 22A to 22C together with FIG. 9, a method of fabricating a semiconductor device in accordance with still another embodiment will be described.

Referring to FIG. 22A, as described in FIGS. 14A and 14B, the gate trench 20 may be formed across the active region 5a of the semiconductor substrate 1, and the gate dielectric layer 25 may be formed on the gate trench 20.

A first barrier conductive pattern 31 and a first gate conductive pattern 736 may be formed on the gate dielectric layer 25 using the same method described in FIGS. 21A and 21B. The first gate conductive pattern 736 may correspond to the first gate conductive pattern 636 of FIG. 21B. A second barrier conductive layer 745 may be formed on the substrate having the first barrier conductive pattern 31 and first gate conductive pattern 736. The first gate conductive pattern 736 may be formed of a first metal material such as W, and the second barrier conductive layer 745 may be formed of a nitride, such as WN, or carbide, such as WC, of the first metal material.

Referring to FIG. 22B, a second barrier conductive spacer may be formed by anisotrophically etching the second barrier conductive layer 745. A second gate conductive layer may be formed on the substrate having the second barrier conductive spacer. The second gate conductive layer may have an upper seam extending from a center of an upper surface to the inside thereof. A second gate conductive pattern 751 and a second barrier conductive pattern 746 may be formed by partially etching the second gate conductive layer and the second barrier conductive spacer. The second gate conductive pattern 751 may include a remaining upper seam S2'. The second gate conductive pattern 751 may be in contact with the first gate conductive pattern 736. The second barrier conductive pattern 746 may be interposed between the second gate conductive pattern 751 and the gate dielectric layer 25. The first and second gate conductive patterns 736 and 751, and the first and second barrier conductive patterns 31 and 746 may configure a gate electrode 770.

Referring to FIG. 22C, an insulating capping layer 790 may be formed on the substrate having the gate electrode 770.

Referring again to FIG. 9, an insulating capping pattern 791 may be formed by planarizing the insulating capping layer 790. During the planarization of the insulating capping layer 790, the gate mask 15 may be removed.

Next, referring to FIGS. 23A to 23C together with FIG. 10, a method of fabricating a semiconductor device in accordance with still another embodiment will be described.

Referring to FIG. 23A, as described in FIGS. 14A and 14B, the gate trench 20 may be formed across the active region 5a of the semiconductor substrate 1, and the gate dielectric layer 25 may be formed on the gate trench 20.

A first barrier conductive pattern 31 and a first gate conductive pattern 836 may be formed on the gate dielectric layer 25 using the same method described in FIGS. 21A and 21B. The first gate conductive pattern 836 may correspond to the first gate conductive pattern 636 of FIG. 21B.

A second barrier conductive layer may be conformally formed on the substrate having the first barrier conductive pattern 31 and first gate conductive pattern 836, and a second gate conductive layer may be formed on the second barrier conductive layer.

A second gate conductive pattern 851 and a second barrier conductive pattern 846 may be formed by partially etching the second gate conductive layer and the second barrier conductive layer.

The second barrier conductive pattern 846 may include a part interposed between the first and second gate conductive patterns 836 and 851, and a part interposed between the second gate conductive pattern 851 and the gate dielectric layer 25.

The first and second gate conductive patterns 836 and 851 may be formed of a first metal material such as W, and the second barrier conductive pattern 846 may be formed of a nitride such as WN of the first metal material.

Referring to FIGS. 23B and 23C, the first and second gate conductive patterns 836 and 851, and the first and second barrier conductive patterns 31 and 846 may be exposed to a first temperature atmosphere 880. An insulating capping layer 890 may be formed on the substrate having the first and second gate conductive patterns 836 and 851, and first and second barrier conductive patterns 31 and 846 at the first temperature atmosphere 880.

The first temperature atmosphere 880 may be a temperature atmosphere at which nitrogen in the second barrier conductive pattern 846 can diffuse into the first and second gate conductive patterns 836 and 851 having a lower nitrogen concentration than the second barrier conductive pattern 846. The first temperature atmosphere 880 may be above about 600° C. During the formation of the insulating capping layer 890, the first and second gate conductive patterns 836 and 851 and the second barrier conductive pattern 846 may form a gate conductive pattern 860. The gate conductive pattern 860 and the first barrier conductive pattern 31 may form a gate electrode 870.

Referring again to FIG. 10, an insulating capping pattern 891 may be formed by planarizing the insulating capping layer 890. During the planarization of the insulating capping layer 890, the gate mask 15 may be removed.

Next, referring to FIGS. 24A to 24C together with FIG. 11, still another method of fabricating a semiconductor device in accordance with an embodiment will be described.

Referring to FIG. 24A, as described in FIGS. 14A and 14B, the gate trench 20 may be formed across the active region 5a of the semiconductor substrate 1, and the gate dielectric layer 25 may be formed on the gate trench 20. As described in FIGS. 14C and 14D, the first barrier conductive pattern 31 and the first gate conductive pattern 36 partially filling gate trench 20 may be formed on the gate dielectric layer 25. The first gate conductive pattern 36 may have a lower seam SF.

A second barrier conductive layer may be conformally formed on the substrate having the first barrier conductive pattern 31 and the first gate conductive pattern 36. A second gate conductive layer may be formed on the second barrier conductive layer. A second gate conductive pattern 950 and a second barrier conductive pattern 946 may be formed by partially etching the second gate conductive layer and the second barrier conductive layer. The second barrier conductive pattern 946 may include a part interposed between the second gate conductive pattern 950 and the gate dielectric layer 25, and a part interposed between the second gate conductive pattern 950 and the first gate conductive pattern 36. The second gate conductive pattern 950 may have an upper seam S2'.

The first and second gate conductive patterns 36 and 950 may be formed of a first metal material such as W, the first barrier conductive pattern 31 may be formed of a nitride (e.g., TiN or TaN, etc.) of a second metal material different from the first metal material, and the second barrier conductive pattern 946 may be formed of a carbide such as WC of the first metal material.

Referring to FIGS. 24B and 24C, the substrate having the first and second gate conductive patterns 36 and 950, and the first and second barrier conductive patterns 31 and 946 may be subjected to a heat treatment 980.

The heat treatment 980 may remove the upper seam S2' and grow grains of the first and second gate conductive patterns 36 and 950. The lower seam S1' may remain due to the second barrier conductive pattern 946.

Through the heat treatment 980, electrical characteristics of the grain-grown first and second gate conductive patterns 936 and 951 may be improved. For example, the first and second gate conductive patterns 936 and 951 of which the grains have grown by the heat treatment 980 may have a lower resistance than the first and second gate conductive patterns 36 and 950 before the heat treatment 980 is performed.

The first and second gate conductive patterns 936 and 951, and the first and second barrier conductive patterns 31 and 946 may form a gate electrode 970. An insulating capping layer 990 may be formed on the substrate having the gate electrode 970.

Referring again to FIG. 11, an insulating capping pattern 991 may be formed by planarizing the insulating capping layer 990. During the planarization of the insulating capping layer 990, the gate mask 15 may be removed.

Next, referring to FIGS. 25A to 25C together with FIG. 12, still another method of fabricating a semiconductor device in accordance with an embodiment will be described.

Referring to FIG. 25A, as described in FIGS. 14A and 14B, the gate trench 20 may be formed across the active region 5a of the semiconductor substrate 1, and the gate dielectric layer 25 may be formed on the gate trench 20. As described in FIGS. 21A and 21B, a first barrier conductive pattern 31 and a first gate conductive pattern 1036 may be formed on the gate dielectric layer 25. The first gate conductive pattern 1036 may correspond to the first gate conductive pattern 636 of FIG. 21B.

A second barrier conductive layer may be conformally formed on the substrate having the first barrier conductive pattern 31 and the first gate conductive pattern 1036, and a second gate conductive layer may be formed on the second barrier conductive layer. A second gate conductive pattern 1050 and a second barrier conductive pattern 1046 may be formed by partially etching the second gate conductive layer and the second barrier conductive layer. The second barrier conductive pattern 1046 may have a part interposed between the first and second gate conductive patterns 1036 and 1050, and a part interposed between the second gate conductive pattern 1050 and the gate dielectric layer 25. The second gate conductive pattern 1050 may have an upper seam S2'.

The first and second gate conductive patterns 1036 and 1050 may be formed of a first metal material (e.g., W), the first barrier conductive pattern 31 may be formed of a nitride (e.g., TiN or TaN, etc.) of a second metal material different from the first metal material, and the second barrier conductive pattern 1046 may be formed of a carbide (e.g., WC) of the first metal material.

Referring to FIGS. 25B and 25C, the substrate having the first and second gate conductive patterns 1036 and 1050, and first and second barrier conductive patterns 31 and 1046 may be subjected to a heat treatment 1080. The heat treatment 1080 may remove the upper seam S2' and cause grains of the first and second gate conductive patterns 1036 and 1050 to grow. Through the heat treatment 1080, the grain-grown first and second gate conductive patterns 1036 and 1051 may have improved electrical characteristics. The first and second gate conductive patterns 1036 and 1051, and the first and second barrier conductive patterns 31 and 1046 may form a gate electrode 1070. An insulating capping layer 1090 may be formed on the substrate having the gate electrode 1070.

Referring again to FIG. 12, an insulating capping pattern 1091 may be formed by planarizing the insulating capping layer 1090. During the planarization of the insulating capping layer 1090, the gate mask 15 may be removed.

Next, referring to FIGS. 26A to 26C together with FIG. 13, still another method of fabricating a semiconductor device in accordance with an embodiment will be described.

Referring to FIG. 26A, as described in FIGS. 14A and 14B, the gate trench 20 may be formed across the active region 5a of the semiconductor substrate 1, and the gate dielectric layer 25 may be formed on the gate trench 20. As described in FIGS. 14C and 14D, a first barrier conductive pattern 31 and first gate conductive pattern 36 partially filling the gate trench 20 may be formed on the gate dielectric layer 25. The first gate conductive pattern 36 may have a lower seam S1'.

A second barrier conductive pattern 1146 and a second gate conductive pattern 1151 may be formed on the substrate having the first barrier conductive pattern 31 and the first gate conductive pattern 36 using the same method of forming the second barrier conductive pattern 246 and the second gate conductive pattern 251 in FIGS. 17A and 17B. The second gate conductive pattern 1151 may be in direct contact with the first gate conductive pattern 36 and have an upper seam S2'.

The first and second gate conductive patterns 36 and 1151 may be formed of a first metal material such as W, the first barrier conductive pattern 31 may be formed of a nitride (e.g., TiN or TaN) of a second metal material different from the first metal material, and the second barrier conductive pattern 1146 may be formed of a carbide (e.g., WC) of the first metal material. The first and second gate conductive patterns 36 and 1151 may have grains GR.

Referring to FIG. 26B, the substrate having the second barrier conductive pattern 1146 and the second gate conductive pattern 1151 may be subjected to a heat treatment 1180. Through the heat treatment 1180, grains of the first and second gate conductive patterns 36 and 1151 may grow, and thereby the lower seam S1' and the upper seam S2' may be removed. The heat treatment 1180 may be performed at a temperature from about 750° C. to about 1050° C. Through the heat treatment 1180, boundaries between the first and second gate conductive patterns 36 and 1151 may fade and thereby a gate conductive pattern 1160 may be formed. Through the heat treatment 1180, the gate conductive pattern 1160 may have grown grains GR'. The gate conductive pattern 1160, the first and second barrier conductive patterns 31 and 1146 may configure a gate electrode 1170.

Referring to FIG. 26C, an insulating capping layer 1190 may be formed on the substrate having the gate electrode 1170.

Referring again to FIG. 13, an insulating capping pattern 1191 may be formed by planarizing the insulating capping layer 1190. During the planarization of the insulating capping layer 1190, the gate mask 15 may be removed.

In accordance with an embodiment, a gate electrode, the resistance of which is reduced as well as the leakage current decreased, may be provided. GIDL current characteristics of a DRAM cell transistor including this kind of gate electrode may be improved. Accordingly, refresh characteristics of the DRAM may be improved. In addition, the wordline resistance of the DRAM may be reduced by providing the DRAM cell transistor with the gate electrode having a low resistance.

Figure 27:
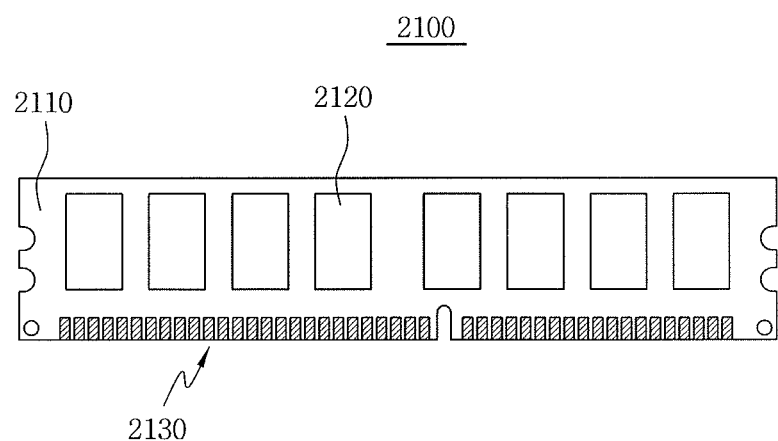
FIG. 27 is a diagram schematically illustrating a memory module including a semiconductor device in accordance with an embodiment.

FIG. 27 is a diagram showing a memory module 2100 including a semiconductor device in accordance with an embodiment.

Referring to FIG. 27, the memory module 2100 may include a memory module substrate 2110, a plurality of memory devices 2120 and terminals 2130 arranged on the memory module substrate 2110.

The memory module substrate 2110 may include a printed circuit board (PCB) or a wafer.

The memory devices 2120 may be one of the semiconductor devices in accordance with embodiments described with reference to FIGS. 1 to 26C, or a semiconductor package including those semiconductor devices. The terminals 2130 may include a conductive metal. The terminals 2130 may be electrically connected to the memory devices 2120. The memory module 2100 may include a semiconductor device of which leakage current characteristics of a transistor and resistance characteristics of a wordline are improved. Accordingly, the module performance may be improved.

Figure 28:
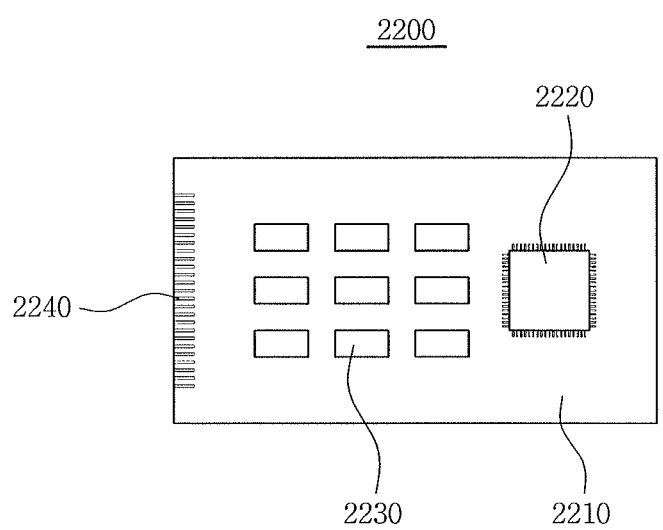
FIG. 28 is a diagram schematically illustrating another semiconductor module including a semiconductor device in accordance with an embodiment.

FIG. 28 is a diagram schematically showing a semiconductor module 2200 including a semiconductor device in accordance with an embodiment.

Referring to FIG. 28, the semiconductor module 2200 may include a semiconductor device 2230 formed on a module substrate 2210. The semiconductor device 2230 may be one of the semiconductor devices in accordance with an embodiment described with reference to FIGS. 1 to 26C, or a semiconductor package including the semiconductor device.

The semiconductor module 2200 may further include a microprocessor 2220 mounted on the module substrate 2210. Input/output terminals 2240 may be arranged at least one edge of the module substrate 2210.

Figure 29:
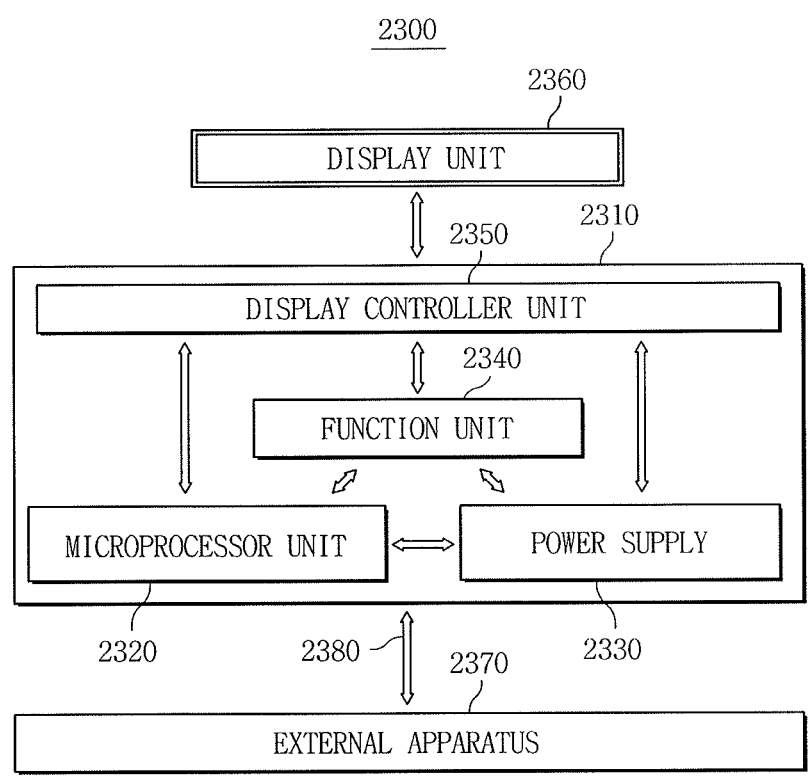
FIG. 29 is a block diagram schematically illustrating an electronic system including a semiconductor device in accordance with an embodiment.

FIG. 29 is a block diagram schematically showing an electronic system 2300 including a semiconductor device in accordance with an embodiment.

Referring to FIG. 29, the electronic system 2300 may include a body 2310. The body 2310 may include a microprocessor unit 2320, a power supply 2330, a function unit 2340, and/or a display controller unit 2350. The body 2310 may be a system board or a motherboard including a printed circuit board (PCB), etc.

The microprocessor unit 2320, the power supply 2330, the function unit 2340, and the display controller unit 2350 may be mounted or installed on the body 2310.

A display unit 2360 may be arranged on an upper surface or an outside of the body 2310. For example, the display unit 2360 may be arranged on a surface of the body 2310 and display an image processed by the display controller unit 2350 of the body 2310.

The power supply 2330 may receive a constant voltage from an external power source, etc., divide the voltage into various levels, and supply those voltages to the microprocessor unit 2320, the function unit 2340, and the display controller unit 2350, etc.

The microprocessor unit 2320 may receive a voltage from the power supply 2330 to control the function unit 2340 and the display unit 2360.

The function unit 2340 may perform various functions of the electronic system 2300. For example, when the electronic system 2300 is a mobile electronic product such as a mobile phone, the function unit 2340 may have several components which can perform wireless communication functions such as output of an image to the display unit 2360 or output of a voice to a speaker, by dialing or communication with an external device. If a camera is installed, the function unit 2340 may function as an image processor.

In other embodiments, when the electronic system 2300 is connected to a memory card, etc. in order to expand capacity, the function unit 2340 may be a memory card controller. The function unit 2340 may exchange signals with an external device 2370 through a wired or wireless communication unit 2380.

In addition, when the electronic system 2300 uses a universal serial bus (USB), etc. in order to expand functionality, the function unit 2340 may function as an interface controller.

A semiconductor device in accordance with an embodiment may be included in at least one of the microprocessor unit 2320 or the function unit 2340.

Figure 30:
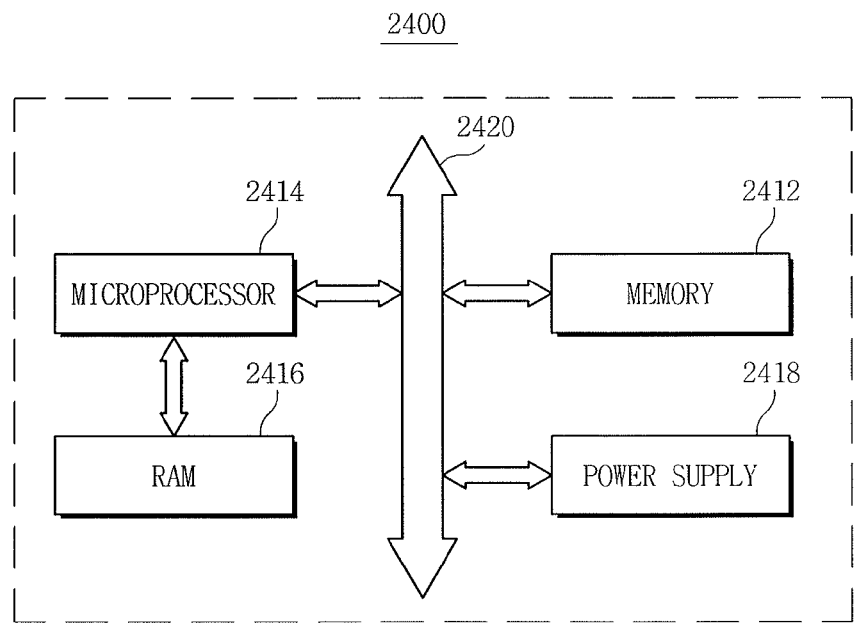
FIG. 30 is a block diagram schematically illustrating another electronic system including a semiconductor device in accordance with an embodiment.

FIG. 30 is a block diagram schematically showing another electronic system 2400 including a semiconductor device in accordance with an embodiment.

Referring to FIG. 30, the electronic system 2400 may include a semiconductor device in accordance with an embodiment. The electronic system 2400 may be used to fabricate a mobile apparatus or a computer. For example, the electronic system 2400 may include a memory system 2412, a microprocessor 2414, a random access memory (RAM) 2416, and a user interface 2418 performing data communication using a bus 2420. The microprocessor 2414 may program and control the electronic system 2400. The RAM 2416 may be used as an operation memory of the microprocessor 2414. The microprocessor 2414, the RAM 2416, and/or other components can be assembled in a single package. The microprocessor 2414 and/or the RAM 2416 may include a semiconductor device in accordance with an embodiment.

The user interface 2418 may be used to input/output data to/from the electronic system 2400. The memory system 2412 may store codes for operating the microprocessor 2414, data processed by the microprocessor 2414, or external input data. The memory system 2412 may include a controller and a memory.

Figure 31:
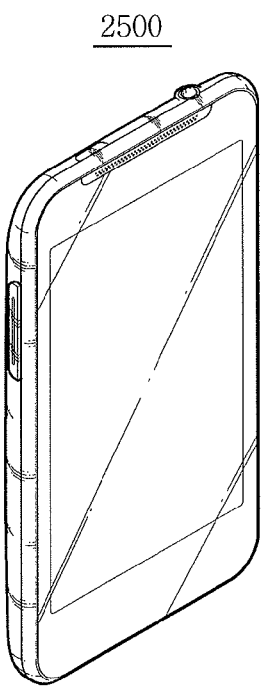
FIG. 31 is a view schematically illustrating a mobile wireless phone including a semiconductor device in accordance with an embodiment.

FIG. 31 is a view schematically showing a mobile wireless phone 2500 including a semiconductor device in accordance with an embodiment. The mobile wireless phone 2500 may be, for example, a tablet PC. Further, a semiconductor device in accordance with an embodiment may be used in a portable computer such as a notebook, an MPEG-1 Audio Layer 3 (MP3) player, an MP4 player, a navigation apparatus, a solid state disk (SSD), a desktop computer, an automobile, or a home appliance, as well as a tablet PC.

By way of summation and review, in a DRAM using a buried channel array transistor (BCAT) used as a switching device, degradation in refresh characteristics due to the leakage current may be an issue. Particularly, in a BCAT, when a metal gate (e.g., TiN/W) having a mid-gap work-function is used as a gate electrode, a leakage current in the source/drain (S/D), for example, a gate induced drain leakage (GIDL) current, due to the influence of the gate electrode may become an issue.

If the gate electrode does not overlap the S/D, the GIDL may decrease. However, since a structure in which the gate electrode does not overlap the S/D reduces the effect of the cell $I_{on}$, electrical characteristics (e.g., tRDL) of a device may be degraded.

Embodiments provide a semiconductor device of which electrical characteristics of a transistor may be improved. Embodiments provide a semiconductor device in which leakage current of a transistor may decrease. Embodiments provide a semiconductor device in which resistance characteristics of a gate electrode of a cell transistor may be improved. Embodiments provide a semiconductor device in which wordline resistance characteristics of a memory device may be improved. Embodiments provide methods of fabricating those semiconductor devices. Embodiments provide an electronic apparatus and electronic system having those semiconductor devices According to embodiments, a dual work function metal gate may be formed in order to reduce GIDL current of a transistor. For example, the GIDL current of the transistor may be reduced by using a conductive material having a lower work function at a part of a gate electrode facing (or overlapping) S/D of a transistor than a conductive material at a part of the gate electrode facing (or overlapping) a channel of the transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a gate trench across an active region of a semiconductor substrate;
    a gate structure filling the gate trench; and
    source/drain regions formed in the active region at respective sides of the gate structure,
    wherein:
    the gate structure includes:
        a sequentially stacked gate electrode and insulating capping pattern, and
        a gate dielectric layer between the gate electrode and the active region,
    the gate electrode is located at a lower level than an upper surface of the active region and includes a barrier conductive pattern and a gate conductive pattern,
    the gate conductive pattern includes a first part having a first width and a second part having a second width greater than the first width, and
    the barrier conductive pattern is interposed between the first part of the gate conductive pattern and the gate dielectric layer, wherein:
        the gate conductive pattern is formed of a material having a lower work function than the barrier conductive pattern, and the second part of the gate conductive pattern directly contacts the gate dielectric layer.

2. The semiconductor device as claimed in claim 1, wherein the gate conductive pattern includes a grain, the grain having a same width as the gate conductive pattern.

3. The semiconductor device as claimed in claim 1, wherein:
the gate conductive pattern includes a first grain in the first part and a second grain in the second part, and
the second grain has a greater width than the first grain in the first part.

4. The semiconductor device as claimed in claim 3, wherein:
the first grain in the first part of the gate conductive pattern has a first width,
the second grain in the second part of the gate conductive pattern has a second width, and
the second width of the second grain is greater than the first width of the first grain.

5. The semiconductor device as claimed in claim 1, wherein the gate conductive pattern includes a grain having a greater width than the barrier conductive pattern.

6. The semiconductor device as claimed in claim 1, wherein at least one of the source/drain regions faces at least a portion of the second part of the gate conductive pattern.

7. The semiconductor device as claimed in claim 1, wherein:
the source/drain regions, the gate dielectric layer, and the gate electrode form a transistor,
the active region located between the source/drain regions constitutes a channel region of the transistor,
the barrier conductive pattern faces the channel region, and
the second part of the gate conductive pattern faces the source/drain regions.

8. The semiconductor device as claimed in claim 1, wherein the second part of the gate conductive pattern covers an upper end of the barrier conductive pattern.

9. The semiconductor device as claimed in claim 1, wherein:
the first part of the gate conductive pattern is spaced apart from the gate dielectric layer, and
the second part of the gate conductive pattern is in contact with the gate dielectric layer.

10. A semiconductor device, comprising:
a gate trench across an active region of a semiconductor substrate;
a gate structure filling the gate trench; and
source/drain regions formed in the active region at respective sides of the gate structure, a buried channel region being defined in the active region between the source/drain regions,
the gate structure including:
a gate dielectric layer lining the gate trench;
a barrier conductive pattern partially lining the gate dielectric layer, the barrier conductive pattern being located in at least a lower portion of the gate trench adjacent to a lower portion of the buried channel region;
a gate conductive pattern in the gate trench, a topmost level of the gate conductive pattern being lower than an upper surface of the active region, an upper portion of the gate conductive pattern overlapping an upper portion of the buried channel region and a lower portion of the source/drain regions, and a lower portion of the gate conductive pattern overlapping the lower portion of the buried channel region; and
an insulating capping layer stacked on the gate conductive pattern,
wherein:
the gate conductive pattern is formed of a metal material having a lower work function than the barrier conductive pattern,
the barrier conductive pattern is between the gate conductive pattern and the gate dielectric layer in at least the lower portion of the gate trench adjacent to the lower portion of the buried channel region, and the upper portion of the gate conductive pattern directly contacts the gate dielectric layer.

11. The semiconductor device as claimed in claim 10, wherein the gate conductive pattern includes at least one of tungsten and nitrogen-containing tungsten, and the barrier conductive pattern includes at least one of titanium nitride or tantalum nitride.

12. A semiconductor device, comprising:
a gate trench across an active region of a semiconductor substrate;
a gate structure filling the gate trench; and
source/drain regions formed in the active region at respective sides of the gate structure, a buried channel region being defined in the active region between the source/drain regions,
the gate structure including:
a gate dielectric layer lining the gate trench;
a barrier conductive pattern partially lining the gate dielectric layer;
a gate conductive pattern in the gate trench, a topmost level of the gate conductive pattern being lower than an upper surface of the active region, an upper portion of the gate conductive pattern overlapping an upper portion of the buried channel region and a lower portion of the source/drain regions, and a lower portion of the gate conductive pattern overlapping the lower portion of the buried channel region; and
an insulating capping layer stacked on the gate conductive pattern,
wherein:
the gate conductive pattern is formed of a metal material having a lower work function than the barrier conductive pattern, and
the barrier conductive pattern includes a first barrier conductive pattern between the lower portion of the gate conductive pattern and the gate dielectric layer, and a second barrier conductive pattern between the upper portion of the gate conductive pattern and the gate dielectric layer.

13. The semiconductor device as claimed in claim 12, wherein the second barrier conductive pattern extends between the upper portion of the gate conductive pattern and the lower portion of the gate conductive pattern.

14. The semiconductor device as claimed in claim 12, wherein the second barrier conductive pattern is formed of a material having a lower work function than the first barrier conductive pattern.

* * * * *